United States Patent [19]
Kaneko

[11] Patent Number: 4,945,441
[45] Date of Patent: Jul. 31, 1990

[54] ZERO-CROSS POINT DETECTING CIRCUIT

[75] Inventor: Kiyotaka Kaneko, Kanagawa, Japan

[73] Assignee: Fuji Photo Film Co., Ltd., Kanagawa, Japan

[21] Appl. No.: 193,955

[22] Filed: May 13, 1988

[30] Foreign Application Priority Data

Aug. 17, 1984 [JP] Japan .................. 59-171345

[51] Int. Cl.$^5$ ............................. G11B 00/00
[52] U.S. Cl. ................................... 360/137
[58] Field of Search ............... 360/72.2, 72.1, 71, 360/73.03, 78.04, 137; 307/354

[56] References Cited

U.S. PATENT DOCUMENTS

| | | | |
|---|---|---|---|
| 3,955,102 | 5/1976 | Chi | 328/147 |
| 4,516,178 | 5/1985 | Lee | 360/78.04 |
| 4,717,969 | 1/1988 | Miyake | 360/73.03 |

Primary Examiner—John H. Wolff
Attorney, Agent, or Firm—Abelman Frayne Rezac & Schwab

[57] ABSTRACT

For the purpose of detection of a zero-cross point of an input signal, the input is applied to one of two input terminals of a comparator which has an inverted input terminal and a non-inverted input terminal, the same bias voltage is applied to each of two input terminals of the comparator from a bias voltage supplying circuit, the value of the bias voltage applied to either the inverted input terminal or the non-inverted input terminal of the comparator is changed by a bias voltage changing circuit from that determined by the bias voltage supplying circuit depending on whether the output of the comparator is in its high or low level, the output of the comparator is a detection signal of the zero-cross point of the input signal.

5 Claims, 15 Drawing Sheets

ZERO-CROSS POINT DETECTING CIRCUIT

This is a continuation of application Ser. No. 765,352 filed on Aug. 13, 1985 now abandoned.

BACKGROUND OF THE INVENTION

(1) Field of the Invention

This invention relates to a zero-cross point detecting circuit. More particularly, the present invention relates to an improved zero-cross point detecting circuit in which, in order to detect a PG (a phase generator) signal for the purpose of detection of the rotation phase and rotation speed of a magnetic disk, the center of a PG yoke disposed in a central core of the magnetic disk is detected by a PG coil interlinked by leakage flux of a central-core attracting magnet provided in a spindle motor, so and to obtain the PG signal accurately indicative of the center of the PG yoke, as described in detail later.

(2) Description of the Prior Art

So-called magnetic disk cameras have recently been developed, which electronically record still pictures on a magnetic disk instead of a silver-halide photographic film. This magnetic disk camera comprises an integral combination of an image pick-up device such as a solid-state image pick-up element or an image pick-up tube and a magnetic disk type recording device. More precisely, as shown in FIG. 22 an optical image of an object 2 is picked up in the form of a still picture by an image pick-up unit 3 through a lens 1, and, after the raster scan type picture signal generated from the image pick-up unit 3 is subjected to signal processing including frequency modulation in a signal processing circuit 6, an output signal of the signal processing circuit 6 is applied through a recording amplifier 7 to a recording magnetic head 5 to be recorded on a predetermined circular track on a rotating magnetic disk 4. The magnetic disk 4 is rotated by a drive unit 8, and the position of the magnetic head 5 on the magnetic disk 4 is determined by a head positioning unit 9. A system for reproducing such a magnetically recorded still picture comprises an integral combination of a magnetic disk type reproducing device and a picture display unit such as a television set or a hard copy dispensing unit such as a printer. More precisely, as shown in FIG. 23, a predetermined track on a rotating magnetic disk 4 is repeately scanned by a reproducing magnetic head 10, and, after an output signal of the magnetic head 10 is applied through a reproducing amplifier 14 to a signal processing circuit 15 to be subject to signal processing including demodulation an output signal of the signal processing circuit 15 is applied to, for example, a television set 11 to display a visible picture of a soft copy on the display screen. Alternatively, the output signal of the signal processing circuit 15 is applied to a printer 12 to be printed out on a recording sheet 13 to provide a hard copy. The magnetic disk 4 is rotated by a drive unit 16, and the position of the magnetic head 10 on the disk 4 is determined by a head positioning unit 17.

By the way, for the purpose of practical use of the magnetic disk camera described above, it is desirable to standardize various particulars of the camera taking into consideration the compatibility of the apparatus. The particulars to be standardized include the shape and size of the magnetic disk 4, the magnetic characteristics of the magnetic disk 4, the rotation speed, track pitch and track width of the magnetic disk 4, the method of picture signal recording including modulation, the recording starting position of the vertical synchronizing signal in a picture signal on a track, and the reference point for determining the recording starting position of the vertical synchronizing signal. The desired standardization of such particulars have been virtually completed up to now. Further, for the purpose of facilitating handling of the magnetic disk 4, especially, for the purposes of, for example, facilitating mounting and detachment of the magnetic disk 4 in and from the body of the magnetic disk camera or reproducing apparatus, improving the accuracy of the mounted position of the magnetic disk 4 in the magnetic disk camera or reproducing apparatus and protecting the recording surface of the magnetic disk 4 against damage, packaging of the magnetic disk 4 has been attempted, and the particulars relevant to the packaging have also been standardized up to now.

As a result of the standardization of the various particulars described above, how to detect the rotation phase of the magnetic disk 4, hence the reference point for recording the vertical synchronizing signal, with high accuracy, has become an important problem. This problem will be explained with reference to FIGS. 24 to 29. FIG. 24 is a plan view of the package (commonly called a pack) of the magnetic disk 4, FIG. 25 is an enlarged sectional view taken along the line A-A in FIG. 24, FIG. 26 illustrates the format of recording, FIG. 27 shows the waveform of leakage flux interlinking a PG coil, FIG. 28 shows the waveform of the output voltage of the PG coil, and FIG. 29 illustrates a prior art method of PG signal detection.

As shown in FIGS. 24 and 25, the package generally designated by the reference numeral 18 is broadly divided into the magnetic disk 4, a central core 19, a PG yoke 20 provided for detecting the rotation phase of the magnetic disk 4, hence, the reference point for determining the recording starting position of the vertical synchronizing signal, and a jacket 21.

The magnetic disk 4 has a central opening and is fixed in position by being sandwiched between a core body 19c and a soft-magnetic plate 19d of the central core 19 extending into the central opening. The core body 19c of the central core 19 is made of a non-magnetic material. The core body 19c has a central bore 19b of generally pentagonal shape for receiving a spindle 24 therein, and a leaf spring 22 is mounted on one of the inner walls of the bore 19b to normally impart its spring force toward the center of the bore 19b. When the spindle 24 rotated by a motor 23 is inserted into the bore 19b of the central core 19, the spindle 24 is pressed against two inner walls of the bore 19b by the force of the leaf spring 22, so that the center of the spindle 24 aligns accurately with the center of the central core 19.

The jacket 21 is a flat hollow casing in which the magnetic disk 4 and the associated central core 19 are rotatably and vertically slightly movably received or accommodated. The jacket 21 includes an upper panel 21a and a lower panel 21c. The upper panel 21a is formed with an opening 21b through which the central core 19 is partly exposed and a window 21f through which a regulating plate (not shown) is disposed opposite to the magnetic disk 4. The lower panel 21c is formed with an opening 21d through which the spindle 24 is inserted and a window 21e through which the magnetic head 5 or 10 is brought into recording or reproducing contact with the magnetic disk 4. The windows 21e and 21f are provided with respective shutters 21g which are opened in the operation mode only.

An annular guide 19e is provided on a lower surface of a plate 19d of soft-magnetic material to guide the rotation of the jacket 21. Further, the spindle 24 includes an annular flange 24a extending into the annular guide 19e of the central core 19, and an annular magnet 25 for attracting the soft-magnetic plate 19d of the central core 19 is disposed inside the annular flange 24a of the spindle 24.

The PG yoke 20 is in the form of a pin of a soft-magnetic material longitudinally buried at a predetermined position in the central core 19 to make magnetic contact with the soft-magnetic plate 19d. A PG coil 26 is mounted at a predetermined position in the body of the magnetic disk camera or reproducing apparatus to be magnetically coupled to the PG yoke 20. The PG coil 26 is electrically connected to a circuit 27 in which a PG signal required for controlling the rotation phase and rotation speed of the magnetic disk 4 is produced on the basis of an output voltage of the PG coil 26. The mechanism for detachably mounting the package 18 in the body of the magnetic disk camera or reproducing apparatus will not be described herein as it has not any concern with the present invention.

Referring to FIG. 26 showing the recording format according to, for example, the NTSC system, the recording starting position of the vertical synchronizing signal (V-sync) is so standardized that the leading edge 28 of the V-sync is delayed by an angle $\Theta$ from a reference position 29. This reference position 29 is determined to be the position lying on the line connecting the center of rotation of the magnetic disk 4, hence, the center of rotation of the central core 19 to the center of the PG yoke 20. It is also so standardized that, in the system where only one of two filed signals composing one frame of a picture signal is recorded on one track in the record mode, and a thru filed signal and a filed signal obtained by delaying the former signal by ½ of one horizontal scanning period (1H) or 0.5H are alternately changed over at a time interval of one vertical scanning period (1V) to reproduce a frame signal in the playback mode, a required switching point should coincide with the reference position 29 described above. In view of the requirements described above, it is necessary to detect the center of the PG yoke 20 by some means. In FIG. 26, the reference numerals 30 and 31 designate a picture signal and tracks respectively, and the reference symbols #1 to #10 designate the numbers of the hoizontal scanning period.

When the package 18 having the structure described above is mounted in the magnetic disk camera or reproducing apparatus, the central core 19 is force-fitted at its bore 19b on the spindle 24 while being automatically centered, and the soft-magnetic plate 19d of the central core 19 is magnetically attracted to the spindle 24 by the function of the magnet 25. Therefore, when the motor 23 is then driven to rotate the spindle 24, the central core 19 and the magnetic disk 4 fixed thereto rotate integrally with the spindle 24 under influence of the biasing force of the leaf spring 22 and the attracting force of the magnet 25. Also, since the PG yoke 20 buried in the central core 19 is magnetized by the magnet 25 through the soft-magnetic plate 19d, leakage flux of the PG yoke 20 interlinks the PG coil 26. Therefore, when the PG coil 26 is mounted at a predetermined position, a point 32 where the flux interlinking the PG coil 26 exhibits its maximum intensity as shown in FIG. 27 corresponds to the center of the PG yoke 20. In terms of the waveform of the output voltage of the PG coil 26, this point 32 exhibiting the maximum flux density or intensity indicates the zero-cross point designated by the reference numeral 33 in FIG. 28. Therefore, when the relative positions of the PG coil 26 and the magnetic head 5 (or 10) in the direction of rotation of the magnetic disk 4 (the direction shown by the arrow 34 in FIG. 26) are previously determined, the recording position of the leading edge 28 of the V-sync and the required switching position can be determined on the basis of the zero-cross point 33 of the waveform of the output voltage of the PG coil 26. For this purpose, it is necessary to obtain a signal or the so-called PG signal accurately indicating the zero-cross point 33.

According to a prior art practice, this PG signal is obtained by differentiating the output voltage waveform of the PG coil 26 by a differentiator, and, then, comparing the differential output signal 35 with a predetermined or fixed reference voltage 36, as shown is FIGS. 29(a) and 29(b). Consequently, it is inevitable that the leading edge 37a of the PG signal 37 deviates by a time $\Delta t$ relative to the zero-cross point 33.

No problem arises when this time deviation $\Delta t$ is constant. However, this time deviation $\Delta t$ is generally dependent upon the level and shape of the differential output signal 35 and dependent also upon the level of the reference voltage 36. Especially, the level of the differential output signal 35 is dependent upon the level of the output voltage of the PG coil 26, and the level of the output voltage of the PG coil 26 is principally dependent upon the positional relation between the PG coil 26 and the PG yoke 20, in addition to the magnetic characteristics and shape of the PG yoke 20. In this case, the PG coil 26 is mounted in the body of the magnetic disk camera or reproducing apparatus, whereas the PG yoke 20 is fixedly mounted in the package 18 which is independent of and detachable from the body of the apparatus. Therefore, it is difficult to accurately maintain the desired fixed positional relation between the PG coil 26 and the PG yoke 20. Especially, in the package 18, an error occurs inevitably in the amount $\Delta l$ of protrusion of the PG yoke 20 from the upper surface of the central core 19, and an error also occurs inevitably in the distance r between the center of the central core 19 and the center of the PG yoke 20. Thus, depending on different packages, the time deviation $\Delta t$ of the leading edge 37a of the PG signal 37 from the zero-cross point 33 tends to greatly vary.

Therefore, it is necessary to develop a method according to which the zero-cross point 33 itself of the output voltage of the PG coil 26 corresponding to the center of the PG yoke 20 can be directly detected without accompanying any time deviation $\Delta t$.

In the case of a VTR (a video tape recorder), the method shown in FIGS. 29(a) and 29(b) is also employed for the detection of the PG signal. In the VTR, however, the PG yoke is mounted on the rotary head drum, and the positional relation between the PG coil and the PG yoke is fixed regardless of withdrawal and replacement of a magnetic tape. Therefore, the time deviation $\Delta t$ is peculiar to each VTR and can be compensated as desired.

SUMMARY OF THE INVENTION

It is a first object of the present invention to provide an improved zero-cross point detecting circuit capable of accurately detecting the center of the PG yoke which is mounted in the central core supporting the magnetic disk and the center of which is detected by the PG coil by utilization of leakage flux of the central-core attracting magnet of the spindle motor for the purpose of detection of the rotation phase of the magnetic disk.

A second object of the present invention is to provide a circuit which can accurately detect not only the desired zero-cross point of the output voltage of the PG coil but also the desired zero-cross point of any other signal waveform.

A third object of the present invention is to provide a circuit which can accurately detect the zero-cross point without being adversely affected by temperature variations.

In accordance with one aspect of the present invention, there is provided a zero-cross point detecting circuit comprising a comparator which has an inverted input terminal and a non-inverted input terminal and to which a signal to be detected is applied, a bias voltage supplying circuit applying the same bias voltage to the inverted input terminal and non-inverted input terminal of the comparator, and a bias voltage changing circuit changing the value of the bias voltage applied to either the inverted input terminal or the non-inverted input terminal from that determined by the bias voltage supplying circuit depending on whether the output of the comparator is in its high or low level.

In accordance with another aspect of the present invention, there is provided a zero-cross point detecting circuit comprising an operational amplifier having an inverted input terminal and a non-inverted input terminal across which a signal to be detected is applied, a bias voltage supplying circuit applying a bias voltage to the non-inverted input terminal of the operational amplifier, a resistor associated with the operational amplifier to constitute a voltage adder circuit together with the operational amplifier, a comparator having an inverted input terminal and a non-inverted input terminal to one of which the same bias voltage as that applied to the operational amplifier is applied from the bias voltage supplying circuit and to the other of which the output of the voltage adder circuit is applied, and a bias voltage changing circuit applying a voltage to a voltage addition input terminal of the voltage adder circuit depending on whether the output of the comparator is in its high or low level, thereby decreasing the bias voltage in the output of the voltage adder circuit.

26 designates a PG coil;
33 designates a zero-cross point;
46 designates an AC amplifier;
48 designates a bias voltage supplying circuit in the form of a resistor bridge circuit;
49 designates a comparator;
51 designates a bias voltage changing circuit;
52 designates a bias voltage supplying circuit;
53 designates an operational amplifier; and
54 designates a voltage adder circuit.

DETAILED DESCRIPTION OF THE PREFERRED EMBODIMENTS

Figure 21:
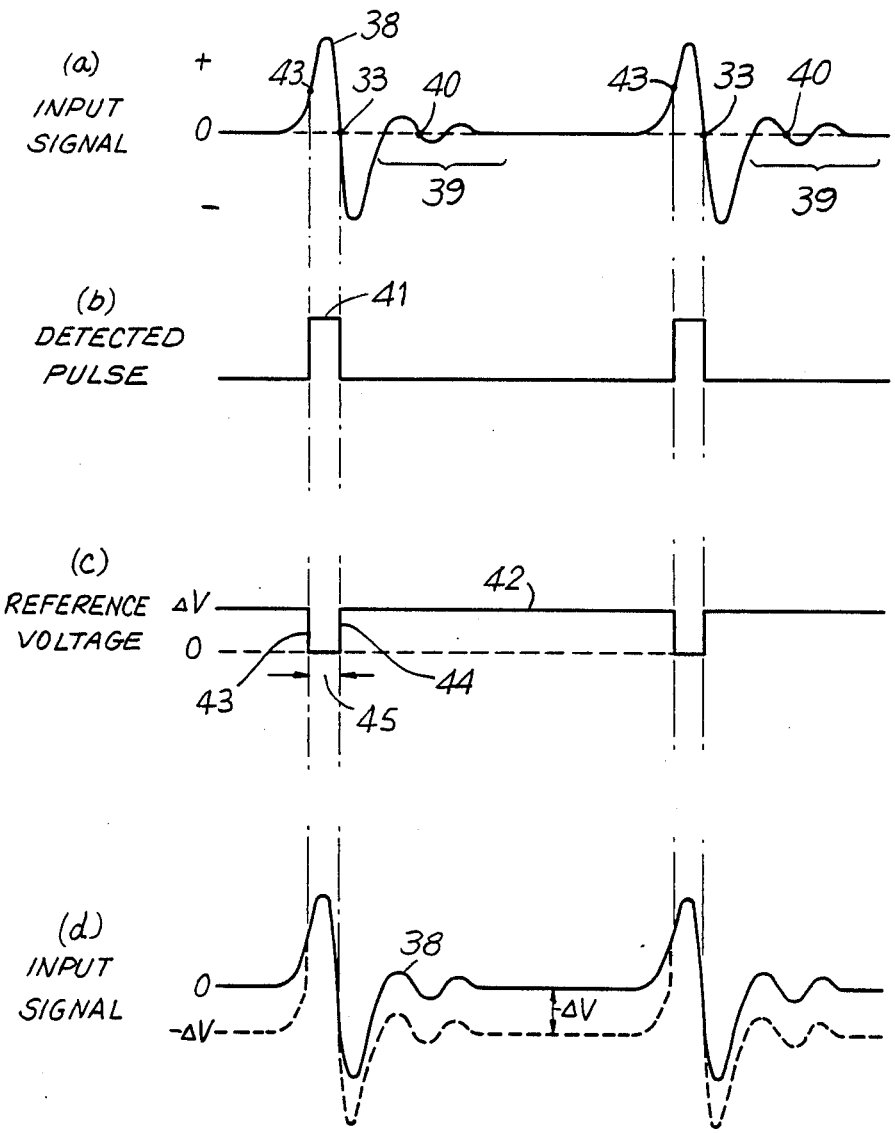
FIG. 21 illustrates the basic principle of the present invention.
Figure 22:
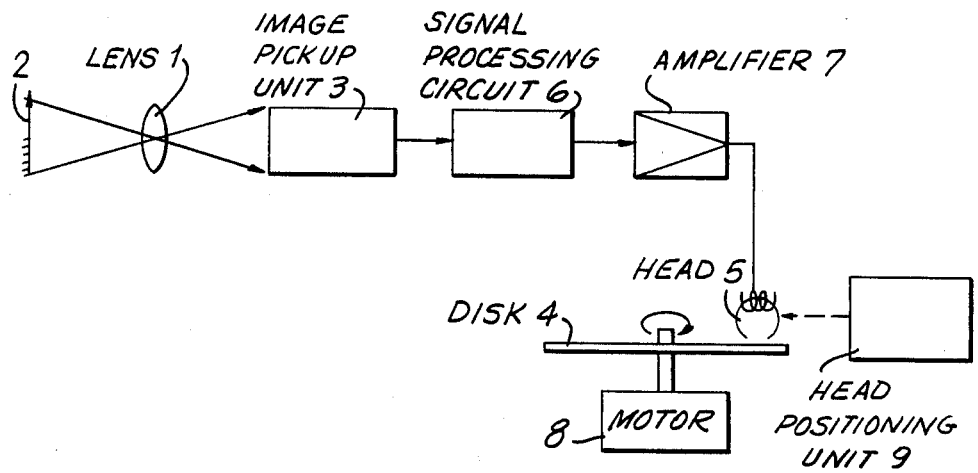
FIG. 22 shows diagrammatically the structure of a magnetic disk camera.
Figure 23:
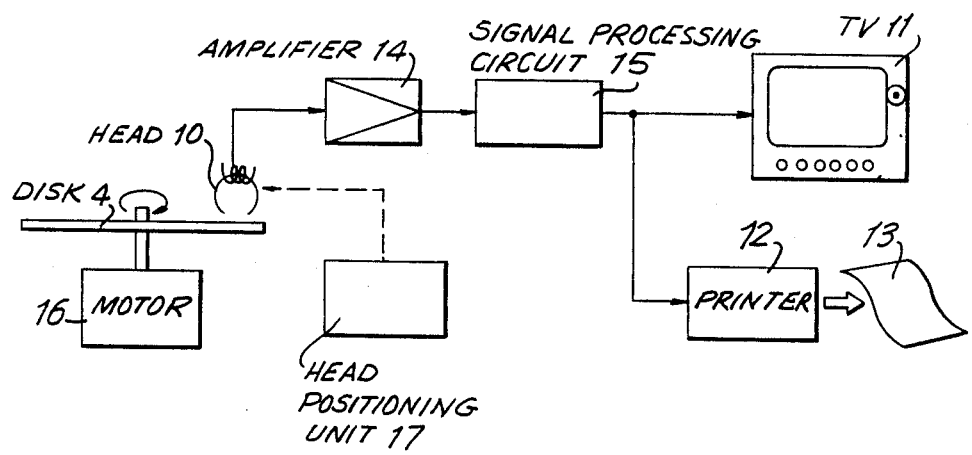
FIG. 23 shows schematically the structure of a reproducing apparatus.

For the purpose of accurate detection of the zero-cross point, it is fundamentally preferable to apply a zero reference voltage to a comparator. However, as shown in FIG. 21(a), the waveform of an input signal 38 such as the PG-Coil output signal having zero-cross points includes, besides the zero-cross point 33 to be detected, a zero level period 39 and an unnecessary zero-cross point 40 attributable to, for example, an oscillation occurred in the circuit. Therefore, it is necessary to exclude the zero level period 39 and the unnecessary zero-cross point 40 from the object of detection. Thus, for the purpose of deriving a detected pulse 41 corresponding to the required zero-cross point 33 only as, for example, shown in FIG. 21(b), it is preferable that the level of a reference voltage 42 applied to the comparator is to be maintained at zero during a period 45 of from time 43 immediately before the zero-cross point 33 to be detected to time 44 of zero-cross point detection, and, in other periods, the reference voltage is to be changed to a level $\Delta V$ capable of detection of the time 43 immediately before the zero-cross point 33, as, for example, shown in FIG. 21(c). Conversely, the level of the reference voltage 42 may be maintained at zero, and the level of the input signal 38 may be changed by $\Delta V$ during the period 45, as shown by the broken lines in FIG. 21(d). The present invention is based on the concept described above, and the bias voltage is changed depending on the output of the comparator so as to substantially change the reference voltage 42 between the zero level and the level of $\Delta V$. However, in view of the fact that a detection error appears unless the reference voltage 42 is accurately maintained at the zero level until the period 45 in which the zero-cross point 33 is detected, bias voltages which are substantially the same are to be continuously applied to the inverted input terminal and non-inverted input terminal respectively of the comparator so as to prevent occurrence of a detection error attributable to temperature variations. The amount $\Delta V$ of the level change of the reference voltage 42 may merely be such that it is enough for the detection of the arrival of the time 43 immediately before the zero-cross point 33. Thus, the value of $\Delta V$ need not be so precise.

EMBODIMENT 1

Figure 1:
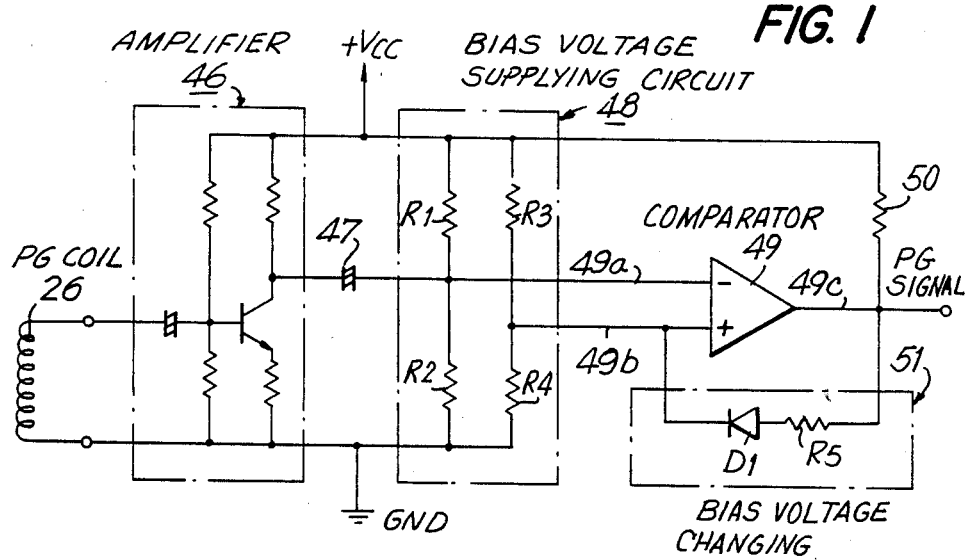
FIGS. 1, 3, 5, 7, 9, 11, 13, 15, 17 and 19 are circuit diagrams of various embodiments respectively of the present invention.

FIG. 1 shows an embodiment of the zero-cross point detecting circuit representing the first aspect of the present invention when used for the detection of the PG signal. In the embodiment 1, it is supposed that the central level of the input signal applied to the circuit is maintained constant.

Referring to FIG. 1, the zero-cross point detecting circuit comprises a polarity inversion type AC amplifier 46 connected to the PG coil 26, an AC coupling capacitor 47, a resistor bridge circuit 48 functioning as a bias voltage supplying circuit, a voltage comparator 49, a pull-up resistor 50, and a bias voltage changing circuit 51. The output signal of the PG coil 26 is amplified by the AC amplifier 46 and is then applied through the AC coupling capacitor 47 to an inverted input terminal 49a of the comparator 49. Resistance values of resistors $R_1$ to $R_4$ constituting the individual arms respectively of the resistor bridge circuit 48 have the relation $R_1/R_2 = R_3/R_4$. The connection point of the resistors $R_1$ and $R_3$ is connected to the positive terminal($+V_{CC}$) of a power source, and the connection point of the resistors $R_2$ and $R_4$ is connected to the negative terminal (GND) of the power source. Further, the connection point of the resistors $R_1$ and $R_2$ is connected to the inverted input terminal 49a of the comparator 49, and the connection point of the resistors $R_3$ and $R_4$ is connected to a non-inverted input terminal 49b of the comparator 49. Thus, the same bias voltage $V_B = V_{cc} \times R_2/(R_1+R_2) = V_{cc} \times R_4/(R_3+R_4)$ is fixedly applied from the same power source to the inverted input terminal 49a and non-inverted input terminal 49b of the comparator 49. The bias voltage changing circuit 51 includes a series circuit of a diode $D_1$ and a resistor $R_5$. In the embodiment 1, the diode $D_1$ is connected between the non-inverted input terminal 49b and the output terminal 49c of the comparator 49. That is, the diode $D_1$ is connected at its cathode to the non-inverted input terminal 49b of the comparator 49. Therefore, the diode $D_1$ is turned on only when a high-level output $V_H$ appears from the output terminal 49c of the comparator 49, with the result that the bias voltage of the non-inverted input terminal 49b increases from $V_B$ to $V_B + \Delta V_1$. It is defined herein that there is the relation $V_H - V_B \geq V_F$, where $V_F$ is the forward voltage of the diode $D_1$. Suppose now that the comparator 49 is of the usual open collector type. Then, the value of $\Delta V_1$ is given by the following equation (1):

$$\Delta V_1 = \frac{R_2{}^3 \cdot R_4 \cdot V_{cc} - (R_3 + R_4)R_3 \cdot R_4 \cdot V_F}{(R_3 + R_4)[R_3 \cdot R_4 + (R_3 + R_4)(R_5 + R_6)]} \quad (1)$$

where, $V_F$ is the forward voltage of the diode $D_1$, and $R_6$ is the resistance value of the pull-up resistor 50.

The value of $\Delta V_1$ is given by the following equation (2) when the high-level voltage $V_H$ is substituted in the equation (1):

$$\Delta V_1 = \frac{-R_3 \cdot R_4{}^2(V_{cc} - V_H) + R_3{}^2 \cdot R_4 \cdot V_H - (R_3 + R_4)R_3 \cdot R_4 \cdot V_F}{(R_3 + R_4)(R_3 \cdot R_4 + R_4 \cdot R_5 + R_5 \cdot R_3)} \quad (2)$$

When the output appearing at the output terminal 49c of the comparator 49 is in its low level $V_L$, the diode $D_1$ is in its off state, and the bias voltage applied to the non-inverted input terminal 49b does not change and is maintained at $V_B$.

Figure 2:
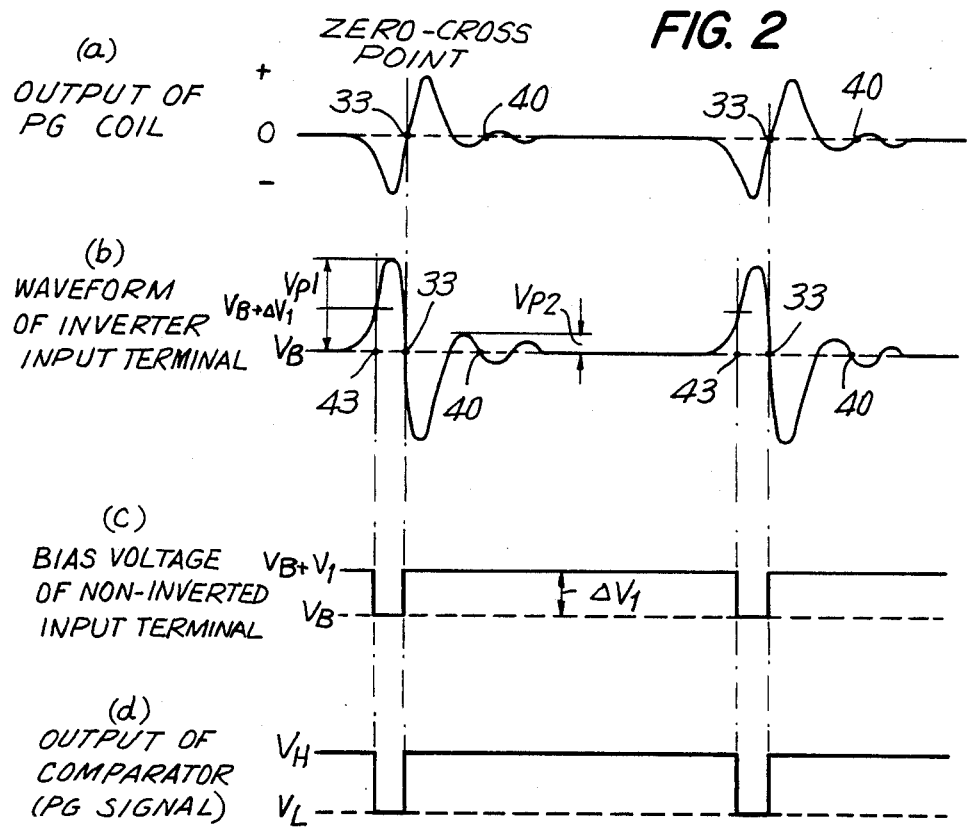
FIGS. 2, 4, 6, 8, 10, 12, 14, 16, 18 and 20 illustrate the operation of the individual embodiments respectively.

The operation of the zero-cross detecting circuit shown in FIG. 1 will be described with reference to FIGS. 2(a) to 2(d). It is herein that the polarity of the waveform of the output signal of the PG coil 26 changes from negative to positive at about the zero-cross point 33 to be detected, as shown in FIG. 2(a). Then, the waveform of the input signal applied to the inverted input terminal 49a of the comparator 49 is such that the inverted waveform of the signal shown in FIG. 2(a) is amplified, and the center level of the input signal is shifted to the level of the bias voltage $V_B$, as shown in FIG. 2(b). When now the output of the comparator 49 is in its high level $V_H$, the bias voltage $V_B + \Delta V_1$ is applied to the non-inverted input terminal 49b of the comparator 49, as shown in FIG. 2(c). Therefore, the output of the comparator 49 is maintained at its high level $V_H$ until the level of the inverted input signal exceeds $V_B + \Delta V_1$. Since the level of the inverted input signal applied to the inverted input terminal 49a increases once at time immediately before the zero-cross point 33, the level of the inverted input signal exceeds $V_B + \Delta V_1$ at time 43, and the output of the comparator 49 turns into its low level $V_L$ at this time 43, as shown in FIG. 2(d). At the same time, the level of the bias voltage applied to the non-inverted input terminal 49b is restored to $V_B$ as shown in FIG. 2(c), and the output of the comparator 49 is maintained at its low level $V_L$ until the zero-cross point 33 is reached. When the zero-cross point 33 is reached under the above condition, that is, as soon as the level of the inverted input signal drops to a level lower than $V_B$, the output of the comparator 49 turns into its high level $V_H$, and the level of the bias voltage applied to the non-inverted input terminal 49b increases from $V_B$ to $V_B + \Delta V_1$. Thus, when the value of $\Delta V_1$ is suitable selected, an unnecessary zero-cross point 40 appearing after the desired zero-cross point 33 is ignored. Preferably, the value of $\Delta V_1$ lies within the following range:

$$V_{p2} < \Delta V_1 < V_{p1} \quad (3)$$

where, $V_{p1}$ is a peak value appearing immediately before the zero-cross point 33 to be detected, and $V_{p2}$ is a peak value appearing immediately before the unnecessary zero-cross point 40. It is needless to mention that the output of the comparator 49 provides the PG signal, and its rising edge coincides with the zero-cross point 33.

The zero-cross point detecting circuit shown in FIG. 1 is advantageous in the following points (1) to (7):

(1) The true zero-cross point 33 itself can be detected.

(2) For the purpose of detection of the zero-cross point 33, the same bias voltage is applied from the resistor bridge circuit 48 to the inverted input terminal 49a and non-inverted input terminal 49b of the comparator 49. The zero-cross point 33 can be detected with very high accuracy, since the resistor bridge circuit 48 can be assembled to operate with high accuracy and without any temperature dependence.

(3) The bias voltage changing circuit 51 includes the diode $D_1$ which is turned off as soon as the output of the comparator 49 turns into its low level. Therefore, regardless of fluctuation, if any, of the collector-emitter voltage VCE(sat) of the output transistor incorporated in the comparator 49 and also regardless of temperature dependence, if any, of the output transistor, the zero-cross point 33 can be detected with high accuracy without being adversely affected by such factors.

(4) The diode $D_1$ is turned on as soon as the output of the comparator 49 turns into its high level. However, no detection error occurs regardless of fluctuation or temperature dependence, if any, of the high level, provided that the condition specified in the expression (3) is satisfied.

(5) No detection error occurs regardless of fluctuation of the power supply voltage ($+V_{cc}$), because the same bias voltage is applied to the inverted input terminal 49a and non-inverted input terminal 49b of the comparator 49.

Figure 24:
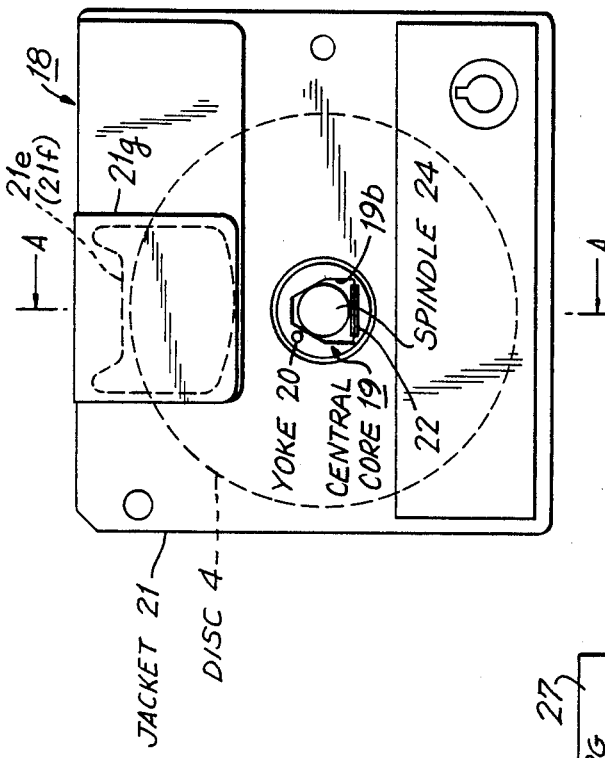
FIG. 24 is a plan view of a magnetic disk package.
Figure 25:
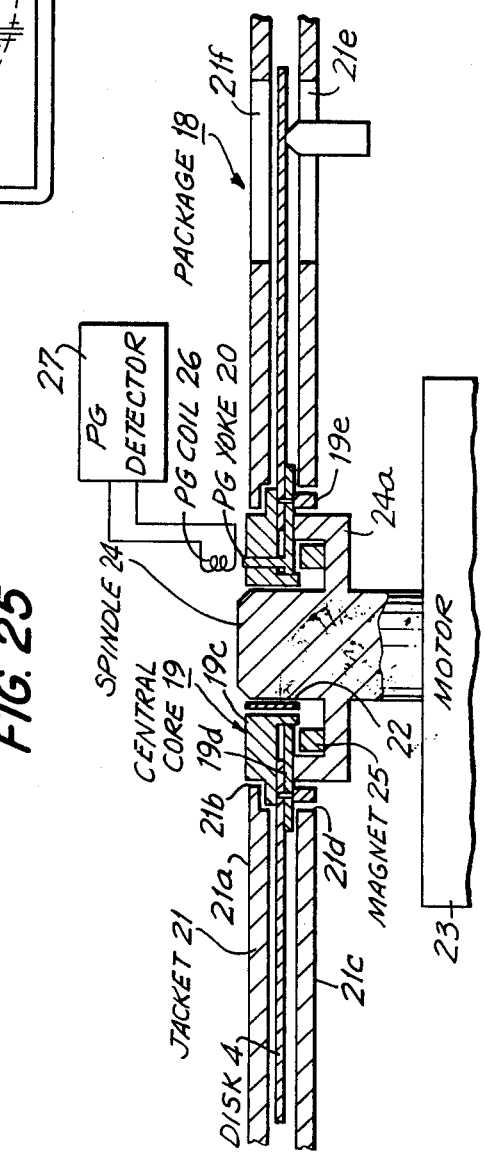
FIG. 25 is an enlarged sectional view taken along the line A—A in FIG. 24.
Figure 26:
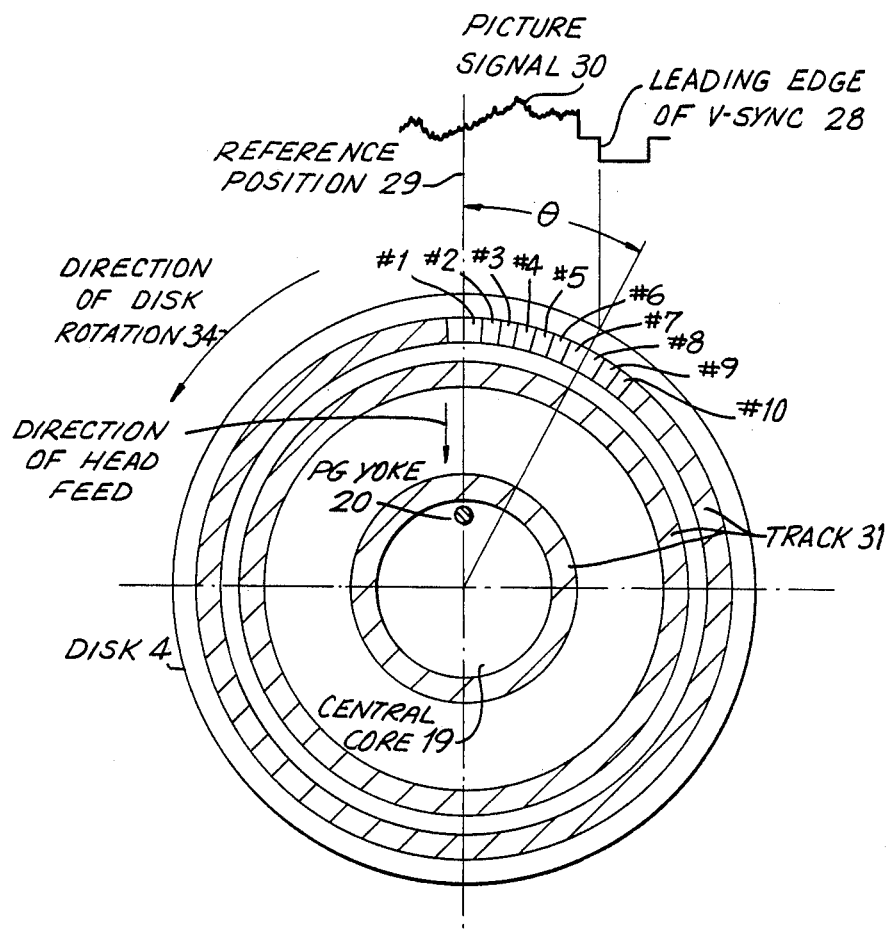
FIG. 26 illustrates a recording format.
Figure 27:
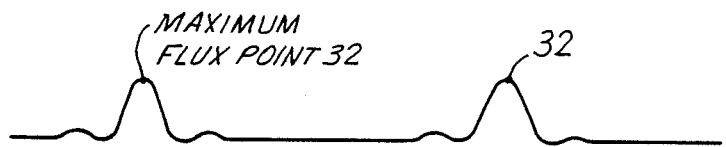
FIG. 27 shows the waveform of leakage flux interlinking the PG coil shown in FIG. 25.
Figure 28:
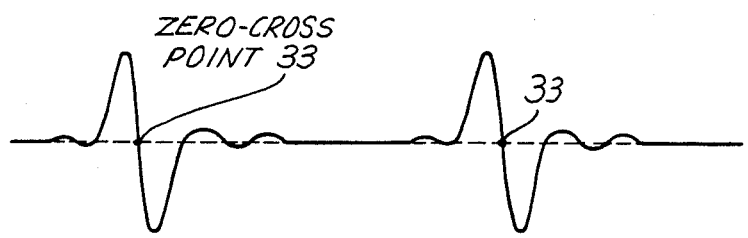
FIG. 28 shows the waveform of the output of the PG coil.
Figure 29:
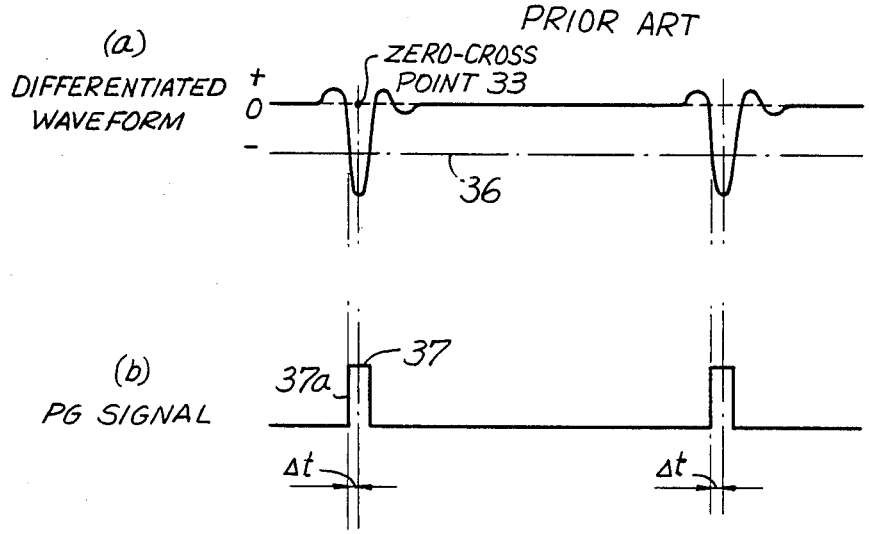
FIG. 29 illustrates a prior art method of PG signal detection.

(6) The zero-cross point 33 can be detected with high accuracy as described above. Therefore, the center of the PG yoke 20 shown in FIGS. 24 to 26 can be accurately detected regardless of the magnetic characteristics, shape and mounted position of the PG yoke 20.

(7) Thus, even when the magnetic characteristics, shape and mounted position of the PG yoke may differ from the designed ones, the center of the PG yoke 20 can be accurately detected.

The zero-cross point detecting circuit shown in FIG. 1 is suitable for application to the detection of the zero-cross point when the input signal applied to the comparator 49 changes from positive to negative relative to the level of the bias voltage $V_B$ as shown in FIG. 2(b).

EMBODIMENT 2

Figure 3:
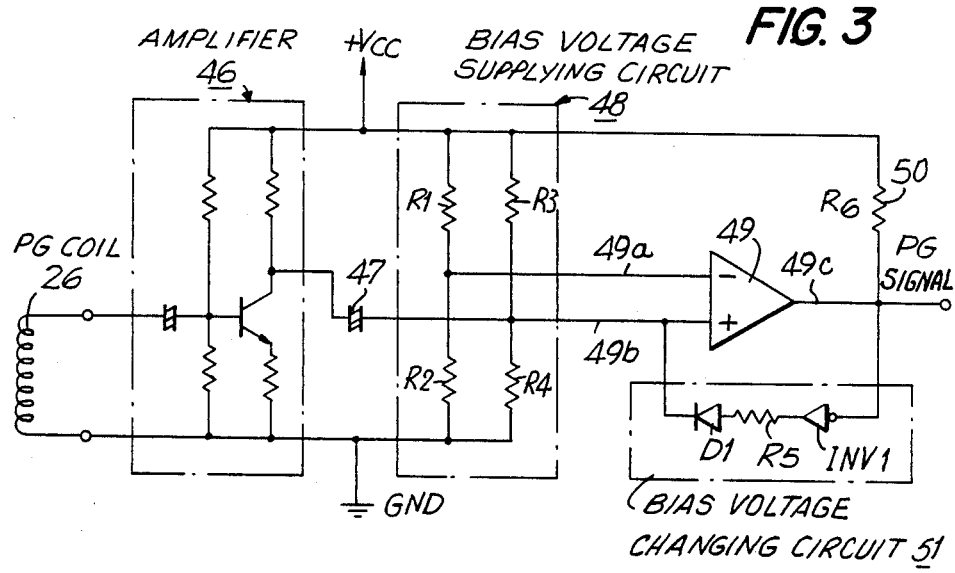
Figure 4:
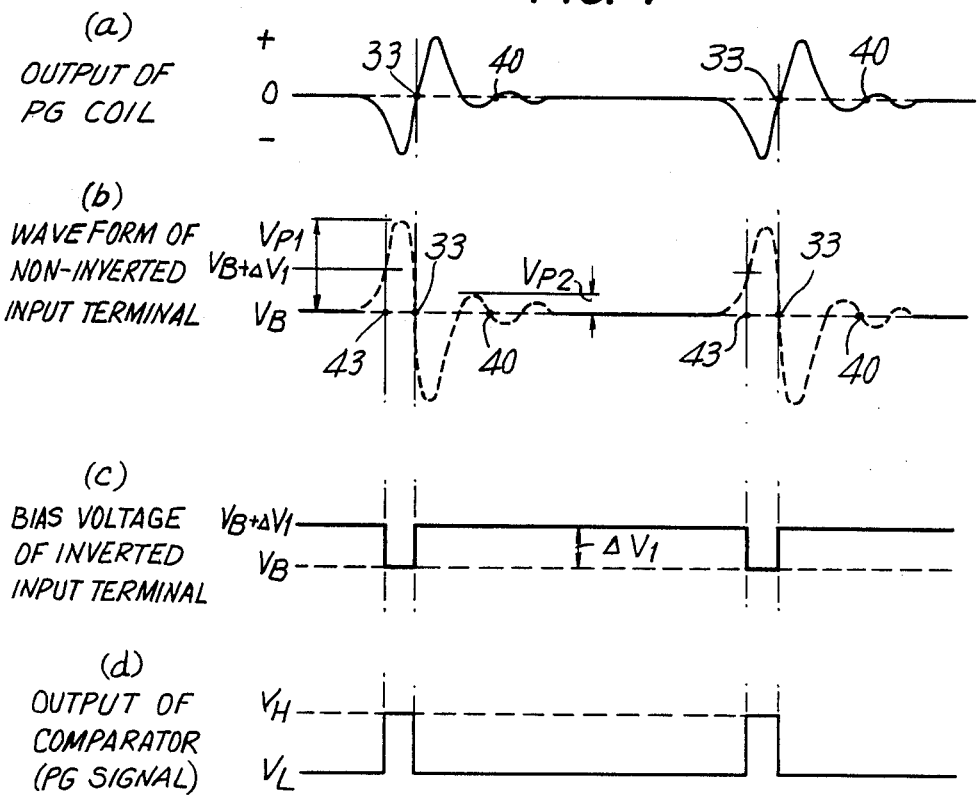

FIG. 3 shows a modification of the zero-cross detecting circuit shown in FIG. 1. This embodiment 2 differs from the embodiment 1 shown in FIG. 1 in that the output of the AC amplifier 46 is applied to the non-inverted input terminal 49b of the comparator 49, an inverter $INV_1$ is additionally provided in the bias voltage changing circuit 51, and the diode $D_1$ is connected at its cathode to the inverted input terminal 49a of the comparator 49. Operating waveform appearing at various parts of FIG. 3 are shown in FIGS. 4(a) to 4(d).

EMBODIMENT 3

Figure 5:
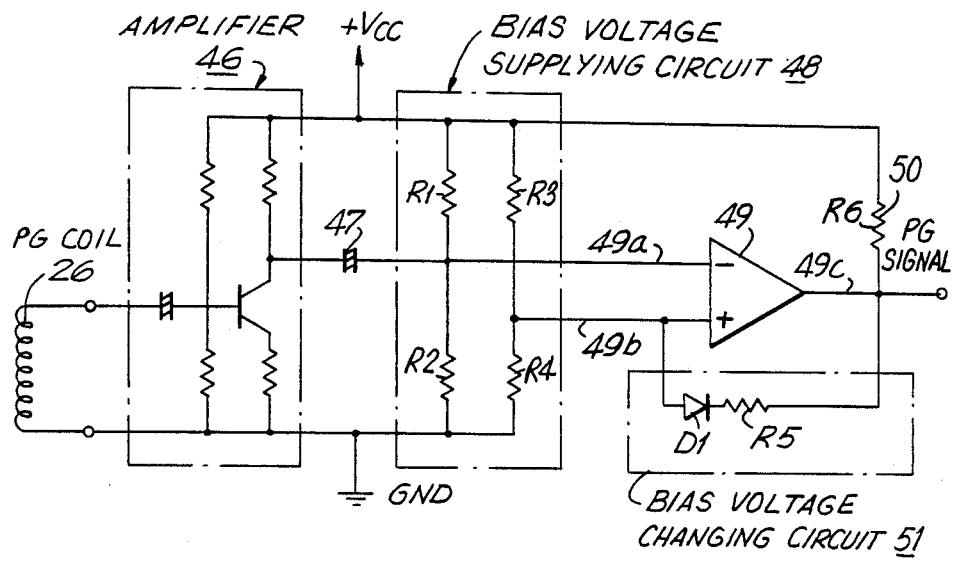
Figure 6:
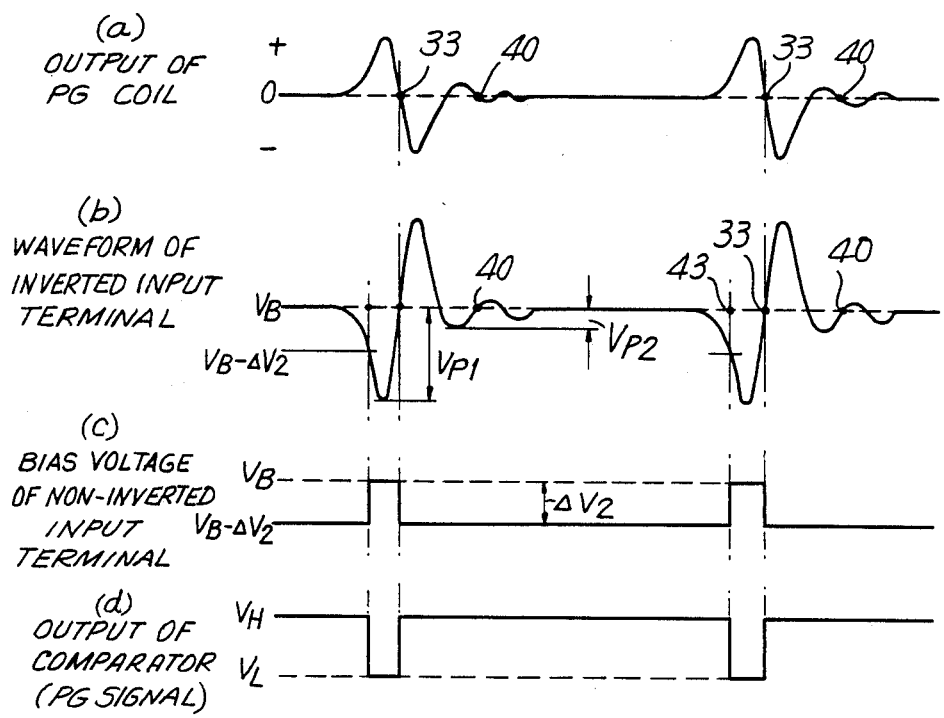

FIG. 5 shows another embodiment of the zero-cross point detecting circuit representing the first aspect of the present invention when used for the detection of the PG signal. In this embodiment 3, the circuit is constructed to detect the zero-cross point when the polarity of the inverted input signal applied to the comparator 49 changes from negative to positive relative to the level of the bias voltage as shown in FIG. 6(b), contrary to the case of FIG. 1. Therefore, the diode $D_1$ in the bias voltage changing circuit 51 is connected in a direction opposite to that shown in FIG. 1. Except for the above difference, the circuit shown in FIG. 5 is the same as that shown in FIG. 1, and the same reference numerals are used to designate the same functional parts to dispense with repetition of the explanation.

Referring to FIG. 5, the diode $D_1$ is connected at its anode to the non-inverted input terminal 49b of the comparator 49. Therefore, when the output appearing at the output terminal 49c of the comparator 49 is in its high level $V_H$, the diode $D_1$ is turned off, and the same bias voltage $V_B$ is applied to the inverted input terminal 49 of the comparator 49. On the other hand, when the output appearing at the output terminal 49c of the comparator 49 is in its low level $V_L$, the diode $D_1$ is turned on, and the level of the bias voltage applied to the non-inverted input terminal 49b of the comparator 49 drops from $V_B$ to $V_B - \Delta V_2$. It is defined herein that there is the relation $V_B - V_L \geq V_F$ where $V_F$ is the forward voltage of the diode $D_1$. The valve of $\Delta V_2$ is given by the following equation (4):

$$\Delta V_2 = \frac{R_3 \cdot R_4{}^2 V_{cc} - (R_3 + R_4)R_3 \cdot R_4(V_F + V_L)}{(R_3 + R_4)[R_3(R_4 + R_5) + R_4 \cdot R_5]} \quad (4)$$

The operation of the zero-cross point detecting circuit shown in FIG. 5 will be described with reference to FIGS. 6(a) to 6(d). It is supposed herein that the polarity of the waveform of the output signal of the PG coil 26 changes from positive to negative at about the zero-cross point 33 to be detected, as shown in FIG. 6(a), contrary to the case of FIG. 2(a). Then, the polarity of the waveform of the input signal applied to the inverted input terminal 49a of the comparator 49 changes from negative to positive relative to the level of the bias voltage $V_B$ at about the zero-cross point 33, as shown in FIG. 6(b). When now the output of the comparator 49 is in its low level $V_L$, the bias voltage applied to the non-inverted input terminal 49b of the comparator 49 drops from $V_B$ to $V_B - \Delta V_2$, as shown in FIG. 6(c). Therefore, the output of the comparator 49 is maintained at its low level until the level of the inverted input signal becomes lower than $V_B - \Delta V_2$. Since the level of the inverted input signal decreases once at time immediately before the zero-cross point 33, the level of the inverted input signal drops to lows than $V_B - \Delta V_2$ at time 43, and the output of the comparator 49 turns into its high level $V_H$ at this time 43, as shown in FIG. 6(d). At the same time, the level of the bias voltage applied to the non-inverted input terminal 49b is restored to $V_B$ as shown in FIG. 6(c), and the output of the comparator 49 is maintained at its high level $V_H$ until the zero-cross point 33 is reached. When the zero-cross point 33 is reached under the above condition, that is, as soon as the level of the inverted input signal exceeds that of $V_B$, the output of the comparator 49 turns into its low level and the level of the bias voltage applied to the non-inverted input terminal 49b decreases from $V_B$ to $V_B - \Delta V_2$. Thus, as unnecessary zero-cross point 40 appearing after the desired zero-cross point 33 can be ignored when the value of $\Delta V_2$ is selected to lie within a suitable range as specified in the relation (3). The comparator output signal shown in FIG. 6(d) provides the PG signal, and its falling edge corresponds to the zero-cross point 33. The zero-cross point detecting circuit shown in FIG. 5 has also the advantages (1) to (7) described already in the embodiment 1.

Fluctuation or temperature dependence of the output of the comparator 49 does not pose any problem. This is because, when the comparator output is in its high level, the diode $D_1$ is turned off to entirely exclude any adverse effects of such factors, while, when the comparator output is in its low level, $\Delta V_2$ only is affected although the diode $D_1$ is turned on.

EMBODIMENT 4

Figure 7:
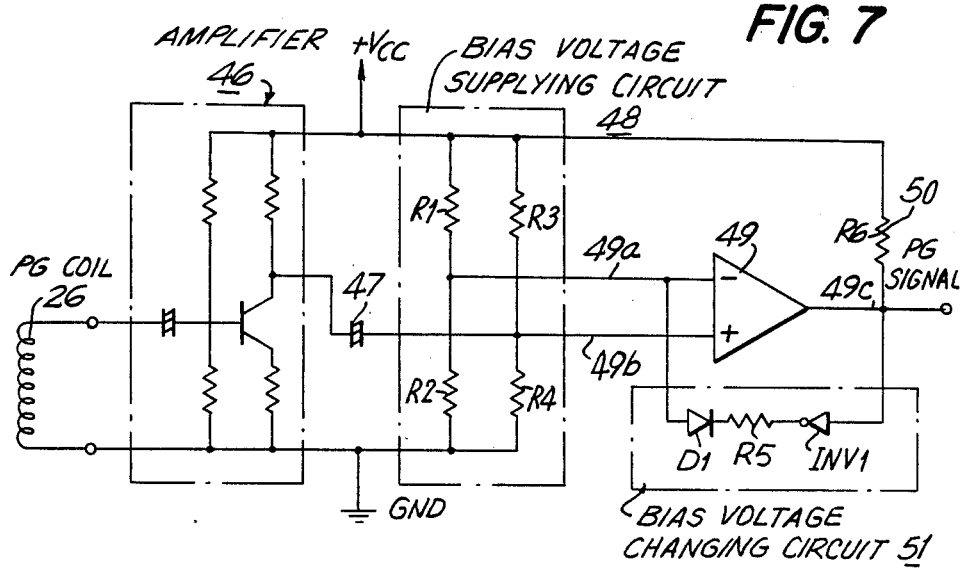
Figure 8:
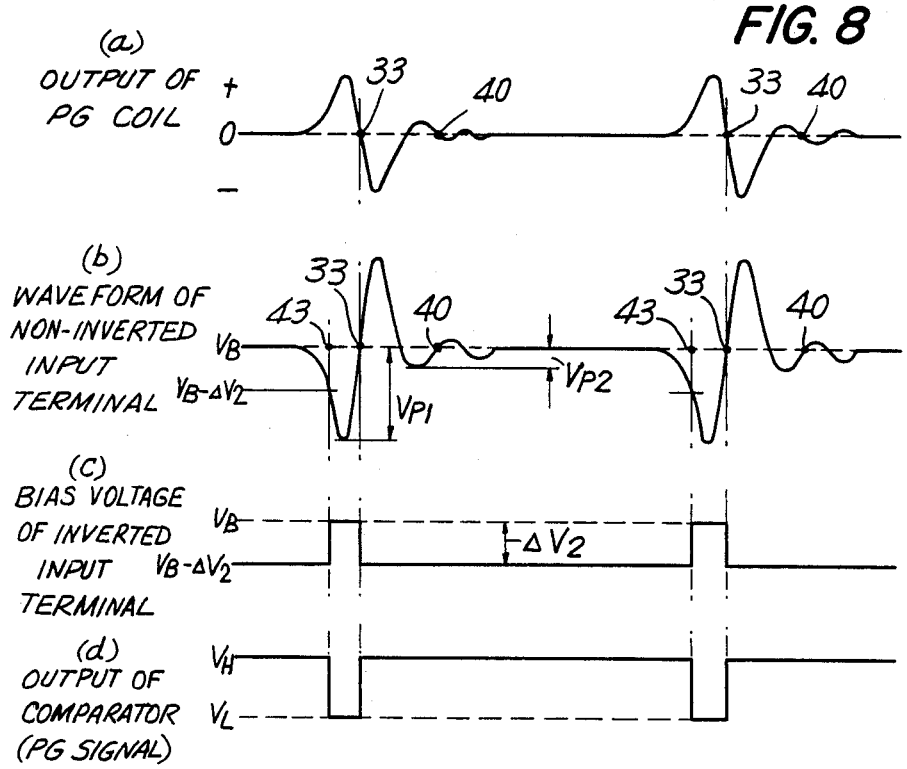

FIG. 7 shows a modification of the zero-cross point detecting circuit shown in FIG. 5. This embodiment 4 differs from the embodiment 3 shown in FIG. 5 in that the output of the AC amplifier 46 is applied to the non-inverted input terminal 49b of the comparator 49, an inverter $INV_1$ is additionally provided in the bias voltage changing circuit 51, and the diode $D_1$ is connected at its anode to the inverted input terminal 49a of the comparator 49. FIGS. 8(a) to 8(d) show operating waveforms appearing a various parts of FIG. 7.

EMBODIMENT 5

Figure 9:
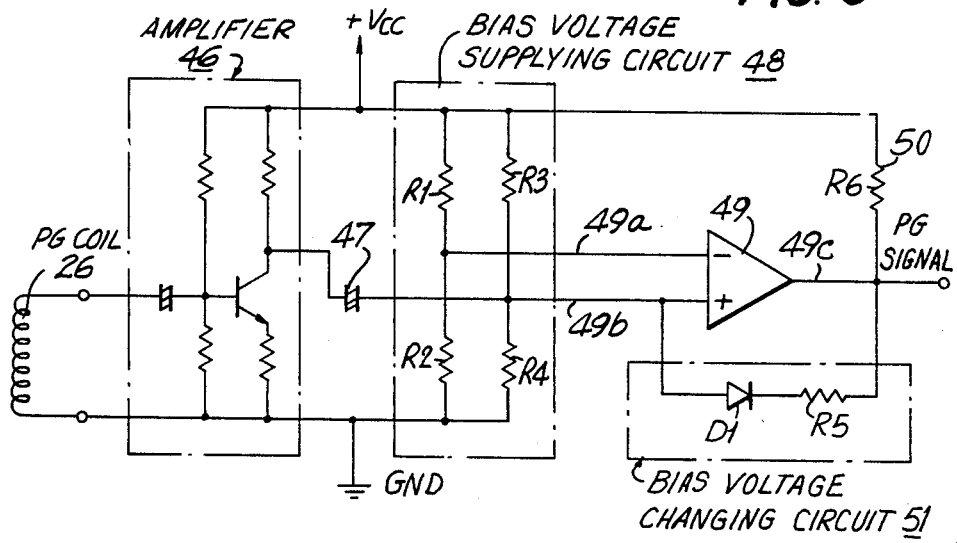

FIG. 9 shows still another embodiment of the present invention. In this embodiment 5, the signal bias voltage is made variable depending on the output of the comparator, whereas, in the embodiments shown in FIGS. 1, 3, 5 and 7, the signal bias voltage is maintained constant. Further, in this embodiment 5, the circuit is so constructed as to detect the zero-cross point of the signal which is applied to the comparator 49 and changes from positive to negative relative to the level of the bias voltage. (Refer to FIG. 8(b)). The zero-cross point detecting circuit shown in FIG. 9 differs from that shown in FIG. 1 in that the output of the AC amplifier 46 is applied to the non-inverted input terminal 49b of the comparator 49, and the diode $D_1$ in the bias voltage changing circuit 51 is connected in an opposite direction. Except for the above differences, the circuit shown in FIG. 9 is the same as that shown in FIG. 1, and the same reference numerals are used to designate the same functional parts to dispense with repetition of the explanation.

Referring to FIG. 9, the constant bias voltage $V_B$ is applied to the inverted input terminal 49a of the comparator 49, and no signal is applied thereto. On the other hand, the output of the AC amplifier 46 is applied to the non-inverted input terminal 49b of the comparator 49, and the diode $D_1$ is connected at its anode to the non-inverted input terminal 49b. Therefore, the level of the signal bias voltage at the non-inverted input terminal 49b changes between $V_B$ and $V_B - \Delta V_2$. More precisely, the diode $D_1$ is turned off when the output appearing at the output terminal 49c of the comparator 49 is in its high level $V_H$, and the same bias voltage $V_B$ is applied to the inverted input terminal 49a and non-inverted input terminal 49b of the comparator 49. On the other hand, when the output appearing at the output terminal 49c of the comparator 49 is in its low level $V_L$, the diode $D_1$ is turned on, with the result that the bias voltage applied to the non-inverted input terminal 49b only drops to the level of $V_B - \Delta V_2$. The value of $\Delta V_2$ is given by the expression (4) described already.

Figure 10:
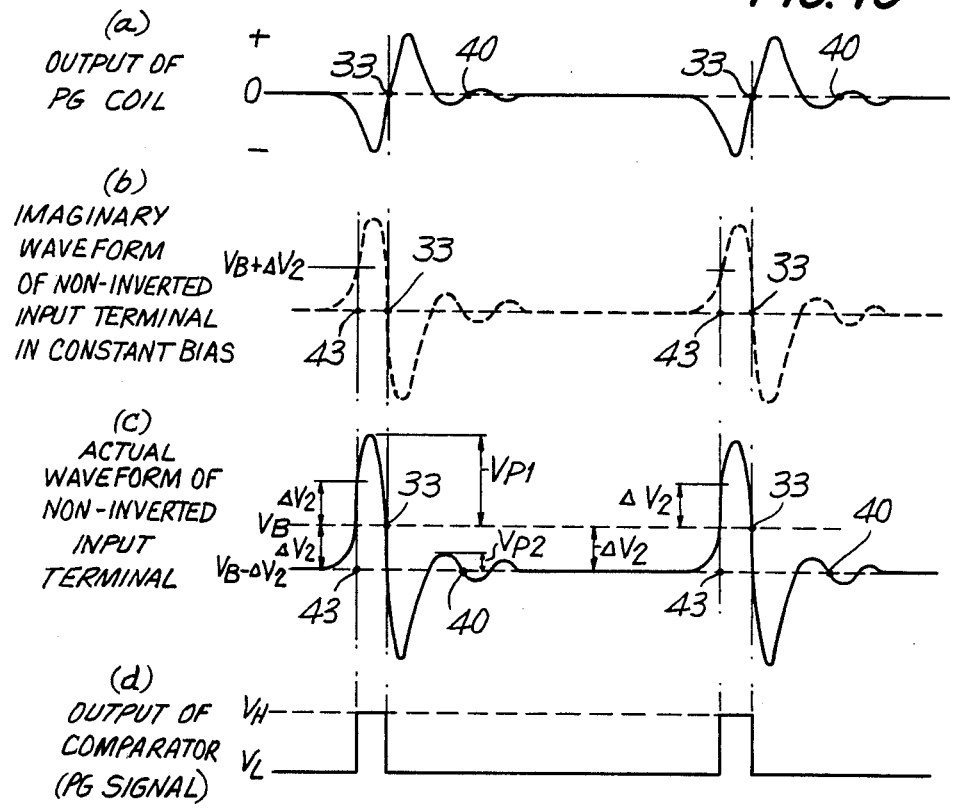

The operation of the zero-cross point detecting circuit shown in FIG. 9 will be described with reference to FIGS. 10(a) of 10(b). It is supposed herein that the polarity of the waveform of the output signal of the PG coil 26 changes from negative to positive at about the zero-cross point 33, as shown in FIG. 10(a). Then, the waveform of the input signal applied to the non-inverted input terminal 49b of the comparator 49 changes from positive to negative relative to the level of $V_B$ at about the zero-cross point 33, as shown by the broken lines in FIG. 10(b), when it is assumed that the bias voltage does not change. However, the bias voltage applied to the non-inverted input terminal 49b decreases from $V_B$ to $V_B - \Delta V_2$ when the output of the comparator 49 is in its low level $V_L$. Therefore, up to time 43 at which the input signal increases to attain a level of $V_B + \Delta V_2$ in FIG. 10(b), the actual waveform of the input signal applied to the non-inverted input terminal 49b changes relative to the level of $V_B - \Delta V_2$, as shown in FIG. 10(c). Further, until this time 43 is reached, the output appearing at the output terminal 49c of the or 49 is maintained at its low level $V_L$ as shown in FIG. 10(d). Then, when the actual input signal applied to the non-inverted input terminal 49b increases to attain the level of $V_B$, the output appearing at the output terminal 49c turns into its high level $V_H$, and, at the same time, the bias voltage applied to the non-inverted input terminal 49b is restored to the level of $V_B$. Therefore, the waveform of the input signal applied to the non-inverted input terminal 49c changes now relative to the level of $V_B$ as shown in FIG. 10(c). Then, when the zero-cross point 33 is reached, the output appearing at the output terminal 49c of the comparator 49 turns into its low level $V_L$, and, at the same time, the bias voltage applied to the non-inverted input terminal 49b drops to the level of $V_B - \Delta V_2$ again. Thus, when the valve of $\Delta V_2$ is selected to lie within a suitable range satisfying the relation similar to the relation (3), an unnecessary zero-cross point 40 appearing after the desired zero-cross point 33 can be ignored. The output of the comparator 49 shown in FIG. 10(d) provides the PG signal, and its falling edge coincides with the zero-cross point 33.

The zero-cross point detecting circuit shown in FIG. 9 has also the advantages (1) to (7) described already in the embodiment 1. Fluctuation or temperature dependence of the output of the comparator 49 would not lead to any adverse effects, since the diode $D_1$ is turned off when the comparator output is in its high level. Also, no problem arises when the comparator output turns into its low level, since $\Delta V_2$ is merely affected although the diode $D_1$ is turned on.

EMBODIMENT 6

Figure 11:
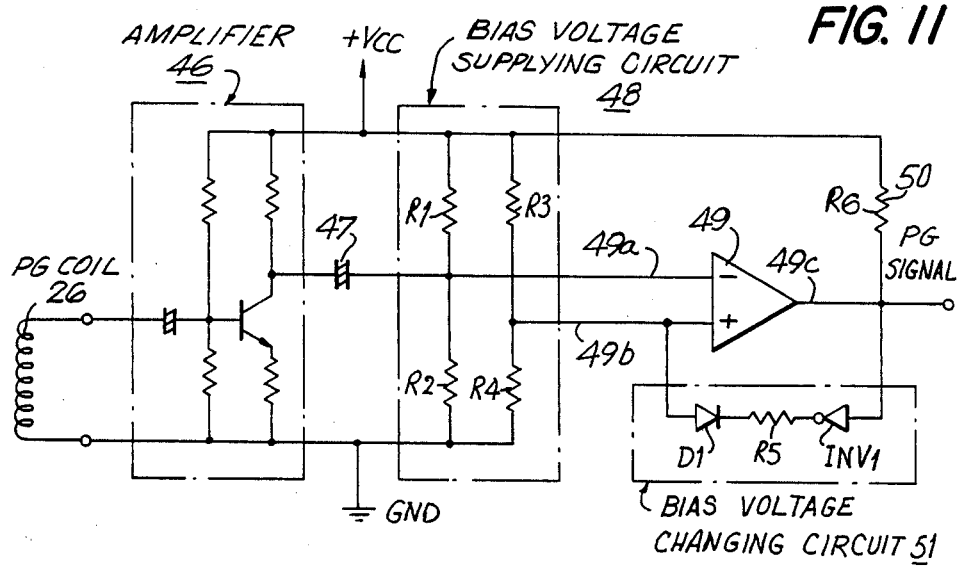
Figure 12:
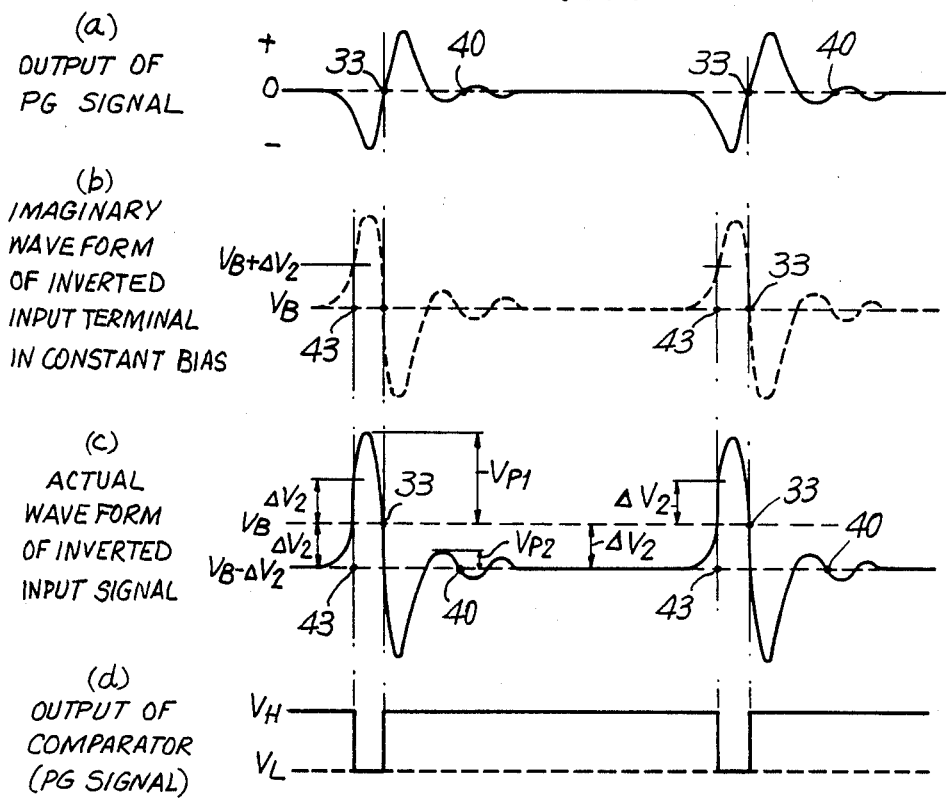

FIG. 11 shows a modification of the zero-cross detecting circuit shown in FIG. 9. The embodiment 6 shown in FIG. 11 differs from the embodiment 5 shown in FIG. 9 in that the output of the AC amplifier 46 is applied to the inverted input terminal 49a of the comparator 49, an inverter $INV_1$ is additionally provided in the bias voltage changing circuit 51, and the diode $D_1$ is connected at its anode to the inverted input terminal 49a of the comparator 49. Operating waveforms appearing at various parts of FIG. 11 are shown in FIG. 12(a) to 12(d).

EMBODIMENT 7

Figure 13:
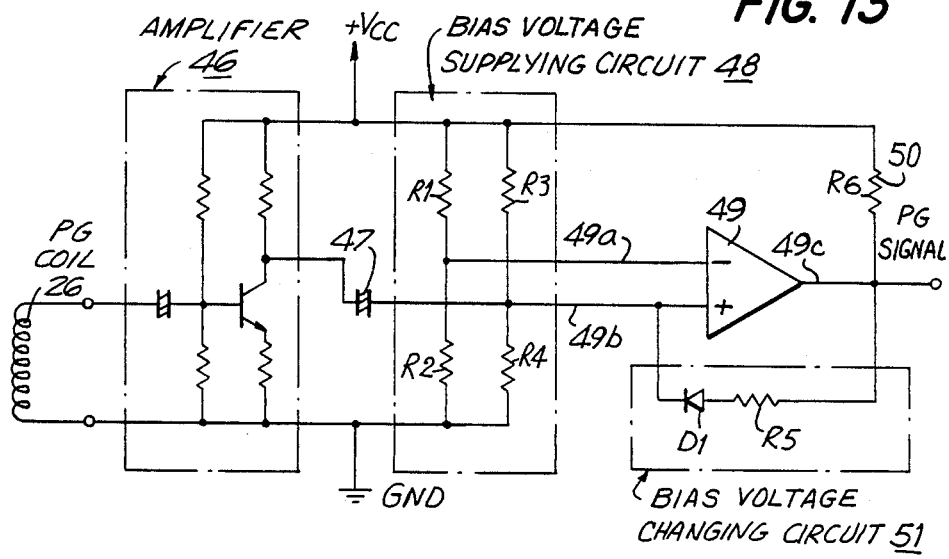

FIG. 13 shows yet another embodiment of the present invention. This embodiment 7 is contrary to the embodiment 5 shown in FIG. 9 in that the circuit detects the zero-cross point of the signal which is applied to the comparator 49 and changes from negative to positive relative to the bias voltage. (Refer to FIG. 14(b)). The zero-cross point detecting circuit shown in FIG. 13 differs merely from that shown in FIG. 1 in that the output of the AC amplifier 46 is coupled to the non-inverted input terminal 49b of the comparator 49, and differs merely from that shown in FIG. 9 in that the diode $D_1$ is connected in an opposite direction. Therefore, when the output appearing at the output terminal 49c of the comparator 49 is in its low level $V_L$, the diode $D_1$ is turned off, and the same bias voltage is applied to the inverted input terminal 49a and non-inverted input terminal 49b of the comparator 49. On the other hand, when the output appearing at the output terminal 49c of the comparator 49 is in its high level $V_H$, the diode $D_1$ is turned on, and the level of the bias voltage biasing the non-inverted input terminal 49b, to which the input signal is applied, increases only from $V_B$ to $V_B + \Delta V_1$. The valve of $\Delta V_1$ is given by the equation (1) or (2) described already.

Figure 14:
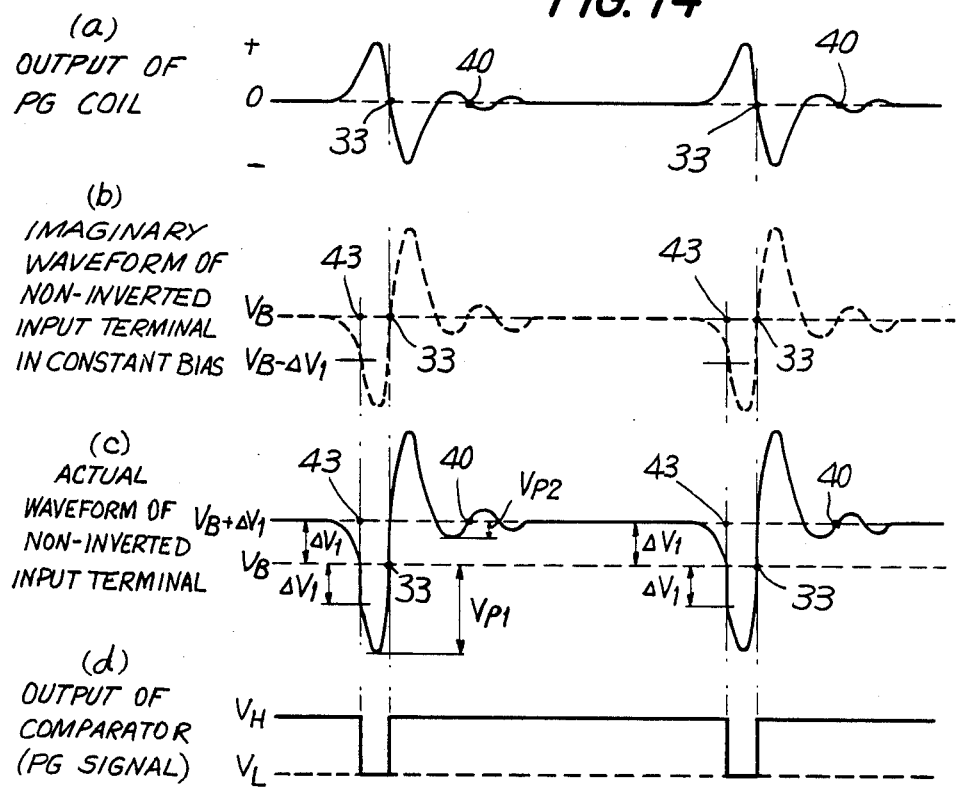

The operation of the zero-cross point detecting circuit shown in FIG. 13 will be described with reference to FIGS. 14(a) to 14(d). It is supposed herein that the polarity of the waveform of the output signal of the PG coil 26 changes from positive to negative at about the zero-cross point 33 to be detected, as shown FIG. 14(a). Then, the waveform of the input signal applied to the non-inverted input terminal 49b of the comparator 49 changes from negative to positive relative to the level of $V_B$ at about the zero-cross point 33, as shown by the broken lines in FIG. 14(b), when it is assumed that the bias voltage does not change. However, the level of the bias voltage applied to the non-inverted input terminal 49b increases from $V_B$ to $V_B + \Delta V_1$ when the output of the comparator 49 is in its high level $V_H$. Therefore, up to time 43 at which the input signal decreases to attain a level of $V_B - \Delta V_1$ in FIG. 14(b), the actual waveform of the input signal applied to the non-inverted input terminal 49b changes relative to the level of $V_B + \Delta V_1$ as shown in FIG. 14(c). Further, until this time 43 is reached, the output appearing at the output terminal 49c of the comparator 49 is maintained at its high level $V_H$ as shown in FIG. 14(d). Then, when the actual input signal applied to the non-inverted input terminal 49b decreases to attain the level of $V_B$, the output appearing at the output terminal 49c turns into its low level $V_L$, and, at the same time, the bias voltage applied to the non-inverted input terminal 49b is restored to the level of $V_B$. Therefore, the waveform of the input signal applied to the non-inverted input terminal 49b changes now relative to the level of $V_B$ as shown in FIG. 14(c). Then, when the zero-cross point 33 is reached, the output appearing at the output terminal 49c of the comparator 49 turns into its high level $V_H$, and, at the same time, the bias voltage applied to the non-inverted input terminal 49b increases to the level of $V_B + \Delta V_1$ again. Thus, when the value of $\Delta V_1$ is suitably selected to lie within the range satisfying the relation (3), an unnecessary zero-cross point 40 appearing after the desired zero-cross point 33 can be ignored. The comparator output shown in FIG. 14(d) provides the PG signal, and its rising edge coincides with the zero-cross point 33.

The zero-cross point detecting circuit shown in FIG. 13 has also the advantages (1) to (7) described already in the embodiment 1.

EMBODIMENT 8

Figure 15:
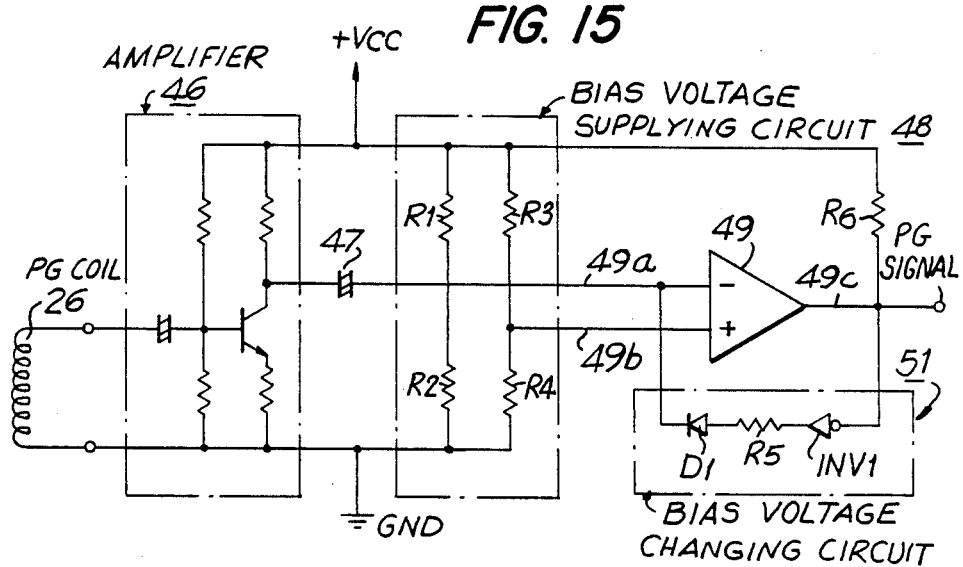
Figure 16:
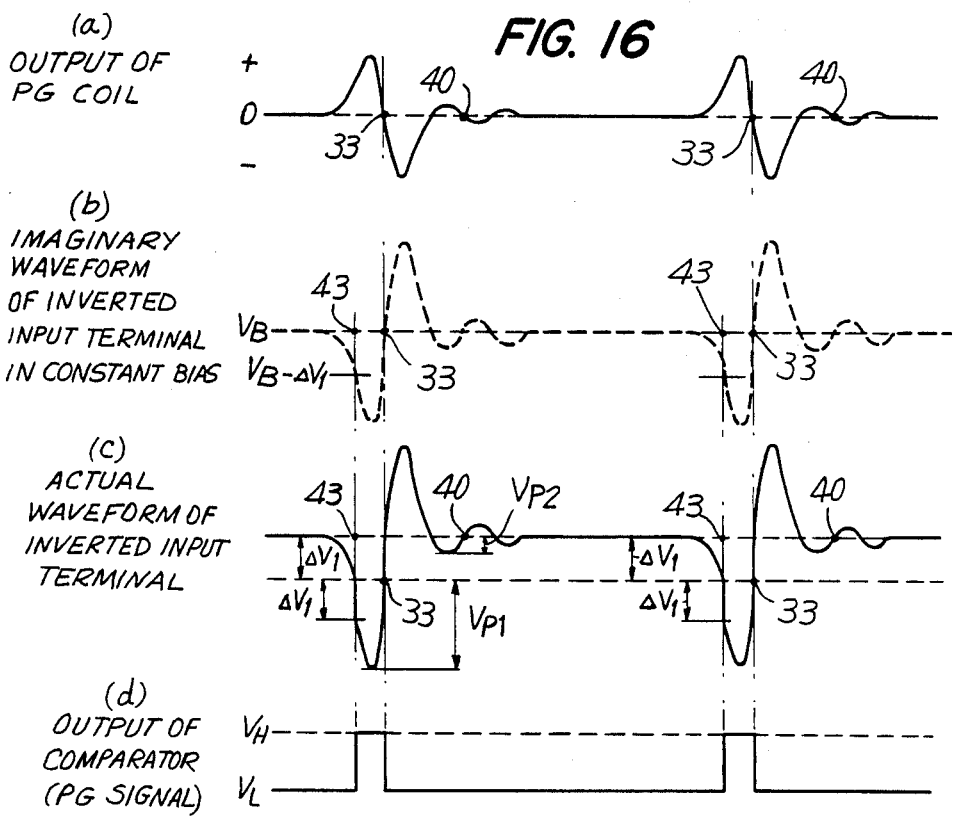

FIG. 15 shows a modification of the zero-cross point detecting circuit shown in FIG. 13. This embodiment 8 differs from the embodiment 7 shown in FIG. 13 in that the output of the AC amplifier 46 is applied to the inverted input terminal 49a of the comparator 49, an inverted INV$_1$ is additionally provided in the bias voltage changing circuit 51, and the diode D: is connected at its cathode to the inverted input terminal 49a of the comparator 49. Operating waveforms appearing at various parts of FIG. 15 are shown in FIGS. 16(a) to 16(d).

EMBODIMENT 9

Figure 17:
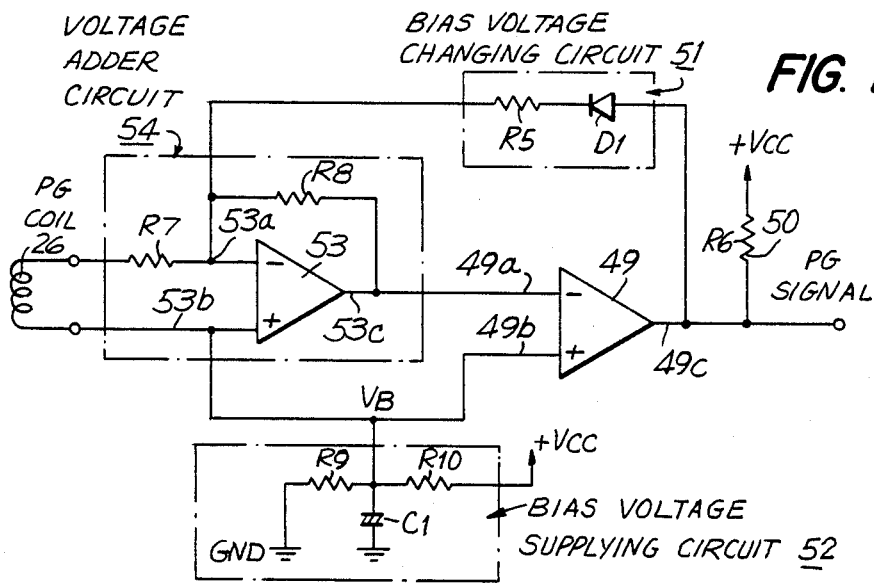

FIG. 17 shows an embodiment of the zero-cross point detecting circuit representing the second aspect of the present invention when used for the detection of the PG signal. Referring to FIG. 17, the zero-cross point detecting circuit comprises the PG coil 26, a voltage comparator 49, a pull-up resistor 50, a bias voltage changing circuit 51, a bias voltage supplying circuit 52, an operational amplifier 53, and a voltage adder circuit 54.

The bias voltage supplying circuit 52 in FIG. 17 is composed of two resistor. R$_9$, R$_{10}$ and a capacitor C$_1$ to produce a bias voltage $V_B$ from a power source voltage +Vcc. This bias voltage $V_B$ is given by the following equation (5):

$$V_B = \frac{R_9}{R_9 + R_{10}} \cdot V_{cc} \quad (5)$$

The bias voltage $V_B$ thus produced is applied to a non-inverted input terminal 49b of the comparator 49 and to a non-inverted input terminal 53b of the operational amplifier 53. The output voltage of the PG coil 26 is applied through a series resistor R$_7$ across an inverted input terminal 53a and the non-inverted input terminal 53b of the operational amplifier 53. The output appearing at the output terminal 53c of the operational amplifier 53 is fed back through a resistor R$_8$ to the inverted input terminal 53a to constitute the voltage adder circuit 54. The bias voltage changing circuit 51 includes a series circuit of a diode D$_1$ and a resistor R$_5$, and the output appearing at the output terminal 49c of the comparator 49 is applied to the voltage adder circuit 54 through the bias voltage changing circuit 51. The output of the voltage adder circuit 54 is applied to the inverted input terminal 49a of the comparator 49.

The diode D$_1$ is in its off state when the output appearing at the output terminal 49c of the comparator 49 is in its low level $V_L$. Therefore, the DC level of the output appearing at the output terminal 53c of the voltage adder circuit 54, hence, the level of the bias voltage biasing the inverted input terminal 49a of the comparator 49 is $V_B$. On the other hand, the diode D$_1$ is in its on state when the output appearing at the output terminal 49c of the comparator 49 is in its high level $V_H$. In this latter case, the level of the bias voltage biasing inverted input terminal 49a of the comparator 49 decreases from $V_B$ to $V_B - \Delta V_3$. It is defined herein that there is the relation $V_H - V_B \geq V_F$, where $V_F$ is the forward voltage of the diode D$_1$. The value of $\Delta V_3$ is given by the following equation (6):

$$\Delta V_3 = \frac{R_8}{R_5} \cdot V_H - \frac{R_5}{R_8} \cdot V_B \quad (6)$$

When the comparator 49 is of the usual open collector type, $\Delta V_3$ is expressed as follows:

$$\Delta V_3 = \frac{R_8}{R_5 + R_6} \cdot V_{cc} - \frac{(R_5 + R_6)}{R_8} \cdot V_B \quad (7)$$

The input signal applied to the inverted input terminal 49a of the comparator 49 is such that the output signal of the PG coil 26, multiplied by the factor of $-(R_7 + R_8)R_7$, is superposed on the DC level changing between $V_B$ and $V_B - \Delta V_3$ as described above.

Figure 18:
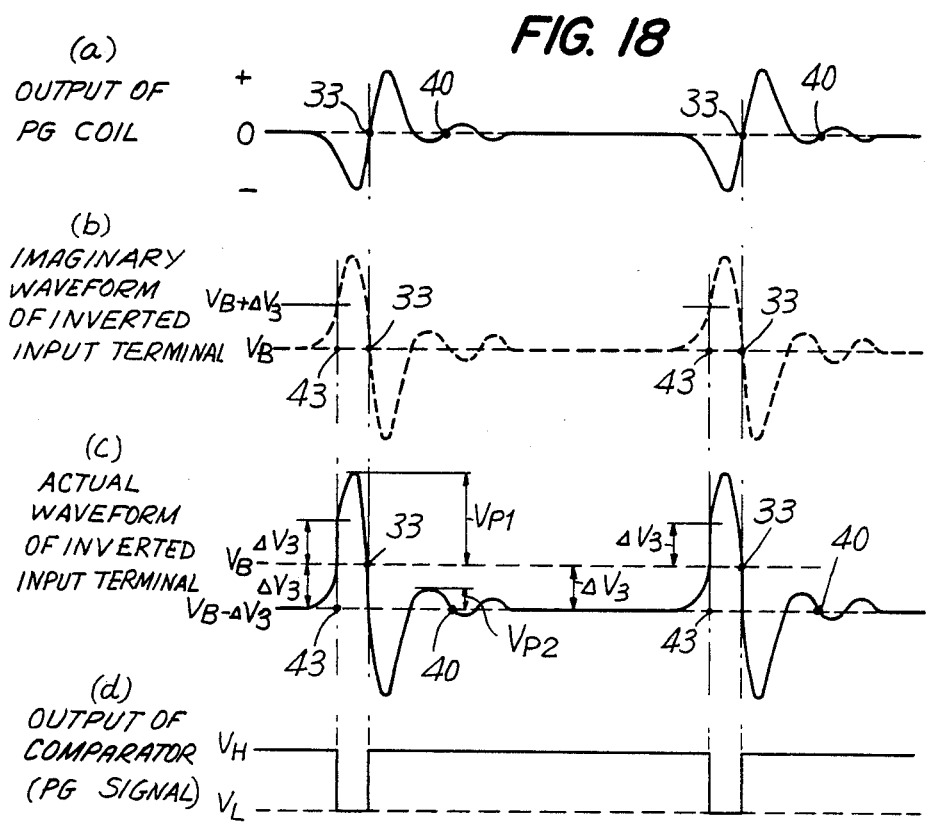

The operation of the zero-cross point detecting circuit shown in FIG. 17 will be described with reference to FIGS. 18(a) to 18(d). It is supposed herein that the polarity of the waveform of the output signal of the PG coil 26 changes from negative to positive at about the zero-cross point 33 to be detected, as shown in FIG. 18(a). It is also assumed that the bias voltage does not change when the diode D$_1$ is in its off state. Then, the waveform of the input signal applied to the inverted input terminal 49a of the comparator 49 changes from positive to negative relative to the level of $V_B$ at about the zero-cross point 33, as shown by the broken lines in FIG. 18(b). However, the level of the bias voltage applied to the inverted input terminal 49a decreases from $V_B$ to $V_B - \Delta V_3$ when the output of the comparator 49 is in its high level $V_H$. Therefore, up to time 43 at which the input signal increases to attain a level of $V_B + \Delta V_3$ in FIG. 18(b), the actual waveform of the input signal applied to the inverted input terminal 49a changes relative to the level of $V_B - \Delta V_3$ as shown in FIG. 18(c). Further, until this time 43 is reached, the output appearing at the output terminal 49c of the comparator 49 is maintained at its high level $V_H$ as shown in FIG. 18(d). Then, when the actual input signal applied to the inverted input terminal 49a increases to attain the level of the $V_B$, the output of the comparator 49 turns into its low level $V_L$, and, at the same time, the bias voltage applied to the inverted input terminal 49a is restored to the level of $V_B$. Therefore, the waveform of the input signal applied to the inverted input terminal 49a changes now relative to the level of $V_B$ as shown in FIG. 18(c). Then, when the zero-cross point 33 is reached, the output of the comparator 49 turns into its high level $V_H$, and, at the same time, the bias voltage applied to the inverted input terminal 49a decreases to the level of $V_B - \Delta V_3$ again. Thus, when the value of $\Delta V_3$ is suitably selected to lie within the range satisfying the relation similar to the relation (3), an unnecessary zero-cross point 40 appearing after the desired zero-cross point 33 can be ignored. The comparator output shown in FIG. 18(d) provides the PG signal, and its rising edge coincides with the zero-cross point 33.

The zero-cross point detecting circuit shown in FIG. 17 is advantageous in the following point (a) to (g):

(a) The desired zero-cross point itself can be detected.

(b) For the purpose of detection of the zero-cross point 33, the same bias voltage is applied from the common bias voltage supplying circuit 52 to the inverted input terminal 49a and non-inverted input terminal 49b of the comparator 49. The zero-cross point 33 can be detected with very high accuracy, since an adverse effect due to fluctuation of the power supply voltage or temperature dependence of the bias voltage supplying circuit 52, if any, can be canceled.

(c) The bias voltage changing circuit 51 includes the diode $D_1$ which is turned off as soon as the output of the comparator 49 turns into its low level. Therefore, regardless of fluctuation, if any, of the collector-emitter voltage VCE(sat) of the output transistor incorporated in the comparator 49 and also regardless of temperature dependence, if any, of the output transistor, the zero-cross point 33 can be detected with high accuracy without being adversely affected by such factors.

(d) The diode $D_1$ is turned on as soon as the output of the comparator 49 turns into its high level. However, no detection error occurs regardless of fluctuation or temperature dependence of the high level, if any, as far as the value of $\Delta V_3$ is selected to lie within a suitable range.

(e) The zero-cross point detecting circuit can operate with improved freedom from noise interference since the comparator output is positively fed back when the comparator output is high level.

(f) The zero-cross point 33 can be detected with high accuracy as described above. Therefore, the center of the PG yoke 20 shown in FIGS. 24 to 26 can be accurately detected regardless of the magnetic characteristics, shape and mounted position of the PG yoke 20.

(g) Thus, even when the magnetic characteristics, shape and mounted position of the PG yoke 20 may slightly differ from the designed ones, the center of the PG yoke 20 can be accurately detected without requiring adjustment.

EMBODIMENT 10

Figure 19:
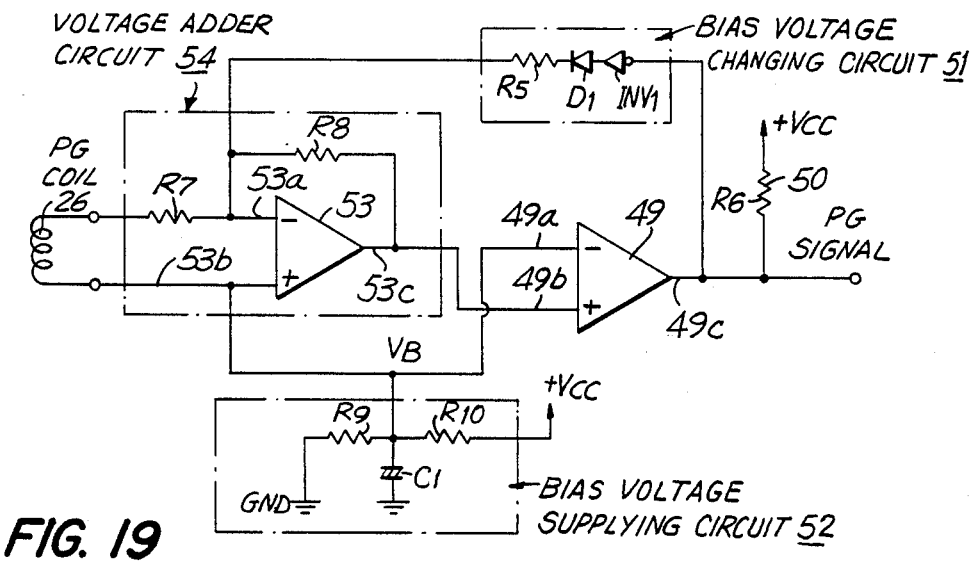
Figure 20:
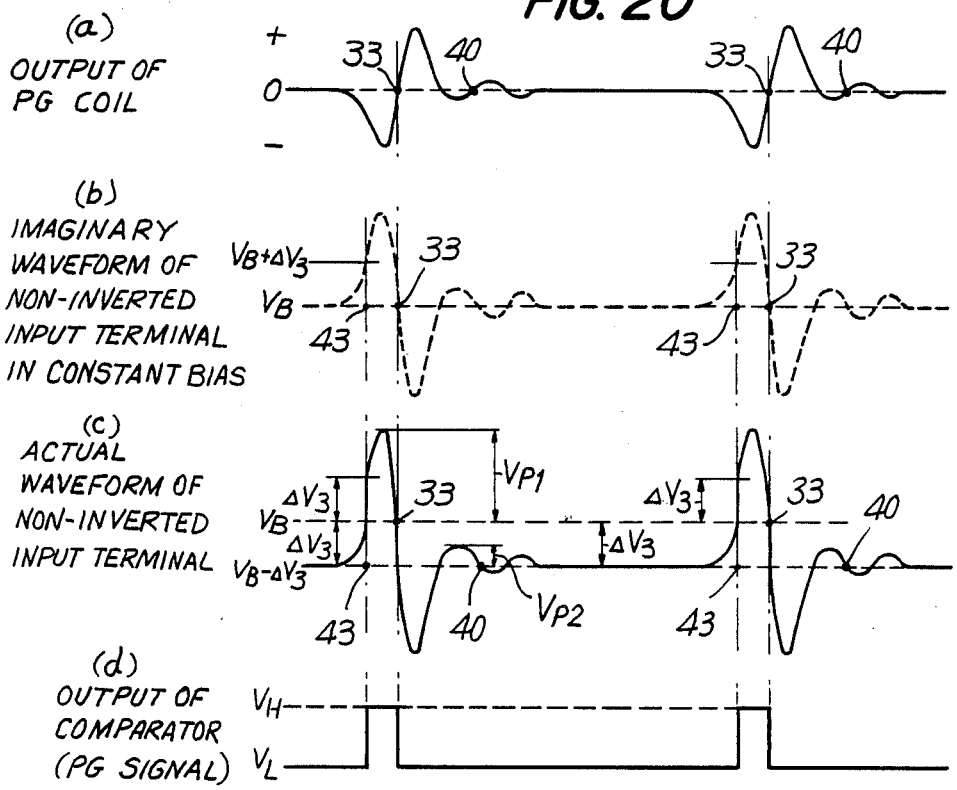

FIG. 19 shows a modification of the zero-cross point detecting circuit shown in FIG. 17. This embodiment 10 differs from the embodiment 9 shown in FIG. 17 in that the output of the voltage adder circuit 54 is applied to the non-inverted input terminal 49b of the comparator 49, the bias voltage $V_B$ is applied from the bias voltage changing circuit 52 to the inverted input terminal 49a of the comparator 49, and an inverter $INV_1$ is additionally provided in the bias voltage changing circuit 51. Operating waveforms appearing at various parts of FIG. 19 are shown in FIG. 20(a) to 20(d).

In the aforementioned embodiments 1 to 10, the bias voltage is changed by means of the diode $D_1$ when the output of the comparator 49 is in its high or low level. However, it is apparent that another electronic switching element such as an FET can be used in place of the diode. When such an electronic switching element is employed, the bias voltage changing circuit 51 need not receive power supply from the output terminal 49c of the comparator 49, and its power source may be either +Vcc or GND. Further, although the embodiments 1 to 10 have been described to illustrate application of the present invention to the detection of the PG signal in a magnetic disk camera and an associated reproducing apparatus, by way of example, it is apparent that the present invention is equally effectively applicable to the detection of the zero-cross point of various kinds of signals.

It will be appreciated from the foregoing detailed description that the zero-cross point detecting circuit according to the present invention can accurately detect the zero-cross point of various signals without being adversely affected by temperature variations.

I claim:

1. A zero-cross point detecting circuit for use in a magnetic recording and/or reproducing apparatus of which the recording medium is a rotating magnetic disk and which has means for generating a signal having a zero-cross point corresponding to a reference point set on said magnetic disk for indicating its rotational phase, said detecting circuit being responsive to said generated signal and comprising:

an operational amplifier having a first inverted input terminal, a second non-inverted input terminal and a third output terminal;

a comparator having a first inverted input terminal, a second non-inverted input terminal and a third output terminal, the third terminal of the comparator being either at a high level or a low level;

a resister connected between the first and third terminals of the amplifier to form therewith a voltage added circuit;

means to apply said generated signal between the first and second terminals of the amplifier;

a bias voltage supplying circuit coupled between the second terminal of the amplifier and one of the first and second terminals of the comparator to apply the same bias voltage thereto;

means connecting the third terminal of the amplifier to the other of the first and second terminals of the comparator; and a bias voltage changing circuit coupled between the third output of the comparator and the first terminal of the amplifier to apply a voltage to the voltage adder circuit which depends upon the level at the third terminal of the comparator.

2. A zero-cross point detecting circuit for use in a magnetic recording and/or reproducing apparatus of which the recording medium is a rotating magnetic disk and which has means for generating a signal having a zero-cross point corresponding to a reference point set on said magnetic disk for indicating its rotational phase, said detecting circuit being responsive to said generated signal and comprising:

a comparator having a first inverted input terminal, a second non-inverted input terminal, and a third output terminal, said signal being supplied to said first terminal for detecting its cross point; said third terminal being either at a high level or a low level;

a bias voltage supplying circuit coupled to said first and second terminals to apply the same bias voltage to both terminals; and a bias voltage changing circuit coupled between said first and second terminals and said third terminal to change the value of the bias voltage applied to one of said first and second terminals when the output of the third terminal is at a high level, and, to change the value of the bias voltage applied to the other of said first and second terminals when the output of the third terminal is at a low level.

3. A zero-cross point detecting circuit claimed in claim 2, wherein said magnetic disk is mounted to a spindle of said apparatus by means of a magnetic attractive force, wherein said magnetic disk has a PG yoke made of a soft-magnetic material, and wherein said signal is generated on the basis of a magnetic flux through said PG yoke.

4. A zero-cross point detecting circuit claimeed in claim 3, wherein said magnetic disk is packed in a casing as a disk pack, and wherein said magnetic disk has a center core in which said PG yoke is fixed.

5. A zero-cross point detecting circuit claimed in claim 4, wherein said apparatus has a PG coil of positioned adjacent to said PG yoke when said disk pack is loaded to said apparatus, and wherein said PG coil generates said signal by a magnetic connection with said PG yoke when said magnetic disk is rotated.

* * * * *